(12) United States Patent
Lee et al.

(10) Patent No.: US 12,272,597 B2
(45) Date of Patent: Apr. 8, 2025

(54) SEMICONDUCTOR INTERCONNECTION STRUCTURES AND METHODS OF FORMING THE SAME

(71) Applicant: TAIWAN SEMICONDUCTOR MANUFACTURING COMPANY, LTD., Hsinchu (TW)

(72) Inventors: Cheng-Chin Lee, Taipei (TW); Hsiao-Kang Chang, Hsinchu (TW); Hsin-Yen Huang, New Taipei (TW); Cherng-Shiaw Tsai, New Taipei (TW); Shao-Kuan Lee, Kaohsiung (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 417 days.

(21) Appl. No.: 17/698,743

(22) Filed: Mar. 18, 2022

(65) Prior Publication Data
US 2022/0406648 A1      Dec. 22, 2022

Related U.S. Application Data

(60) Provisional application No. 63/212,002, filed on Jun. 17, 2021.

(51) Int. Cl.
*H01L 21/768*      (2006.01)
*H01L 23/522*      (2006.01)
*H01L 23/532*      (2006.01)

(52) U.S. Cl.
CPC .... *H01L 21/7682* (2013.01); *H01L 21/76831* (2013.01); *H01L 21/76844* (2013.01); *H01L 21/76846* (2013.01); *H01L 23/5226* (2013.01); *H01L 23/53295* (2013.01); *H01L 21/76849* (2013.01); *H01L 23/53219* (2013.01);
(Continued)

(58) Field of Classification Search
CPC .......... H01L 21/7682; H01L 21/76831; H01L 21/76844; H01L 21/76846; H01L 23/5226; H01L 23/53295; H01L 21/76849; H01L 23/53219; H01L 23/53223; H01L 23/53233; H01L 23/53238; H01L 23/53266; H01L 21/76814; H01L 21/76834; H01L 21/76843
See application file for complete search history.

(56) References Cited

U.S. PATENT DOCUMENTS 9,105,490 B2    8/2015  Wang et al.
9,236,267 B2    1/2016  De et al.
(Continued)

*Primary Examiner* — Douglas W Owens
(74) *Attorney, Agent, or Firm* — NZ Carr Law Office

(57) ABSTRACT

An interconnection structure includes a first dielectric layer, a first conductive feature, a first liner layer, a second conductive feature, a second liner layer, and an air gap. The first conductive feature is disposed in the first dielectric layer. The first liner layer is disposed between the first conductive feature and the first dielectric layer. The second conductive feature penetrates the first dielectric layer. The second liner layer is disposed between the second conductive feature and the first dielectric layer. The air gap is disposed in the first dielectric layer between the first liner layer and the second liner layer. The first liner layer and the second liner layer include metal oxide, metal nitride, or silicon oxide doped carbide.

20 Claims, 24 Drawing Sheets

(52) U.S. Cl.
CPC .. *H01L 23/53223* (2013.01); *H01L 23/53233* (2013.01); *H01L 23/53238* (2013.01); *H01L 23/53266* (2013.01)

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,728,485 B1* | 8/2017 | Lee | H01L 23/3736 |
| 9,831,183 B2 | 11/2017 | Lin et al. | |
| 9,859,386 B2 | 1/2018 | Ho et al. | |
| 2003/0077897 A1* | 4/2003 | Tsai | H01L 21/76807 |
| | | | 438/634 |
| 2012/0205814 A1* | 8/2012 | Wu | H01L 21/02203 |
| | | | 438/653 |
| 2014/0327139 A1* | 11/2014 | Yu | H01L 23/485 |
| | | | 438/653 |
| 2015/0108646 A1* | 4/2015 | Chae | H01L 21/76843 |
| | | | 438/653 |
| 2017/0033043 A1* | 2/2017 | Lin | H01L 21/76826 |
| 2017/0053864 A1* | 2/2017 | Peng | H01L 23/528 |

\* cited by examiner

SEMICONDUCTOR INTERCONNECTION STRUCTURES AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

For manufacturing different conductive layers on the substrate, various structures and manufacturing methods are utilized to form the interconnection structures between the conductive layers. However, the integrated fabrication also brings out some issues, such as reliability, high capacitance, or high resistance. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
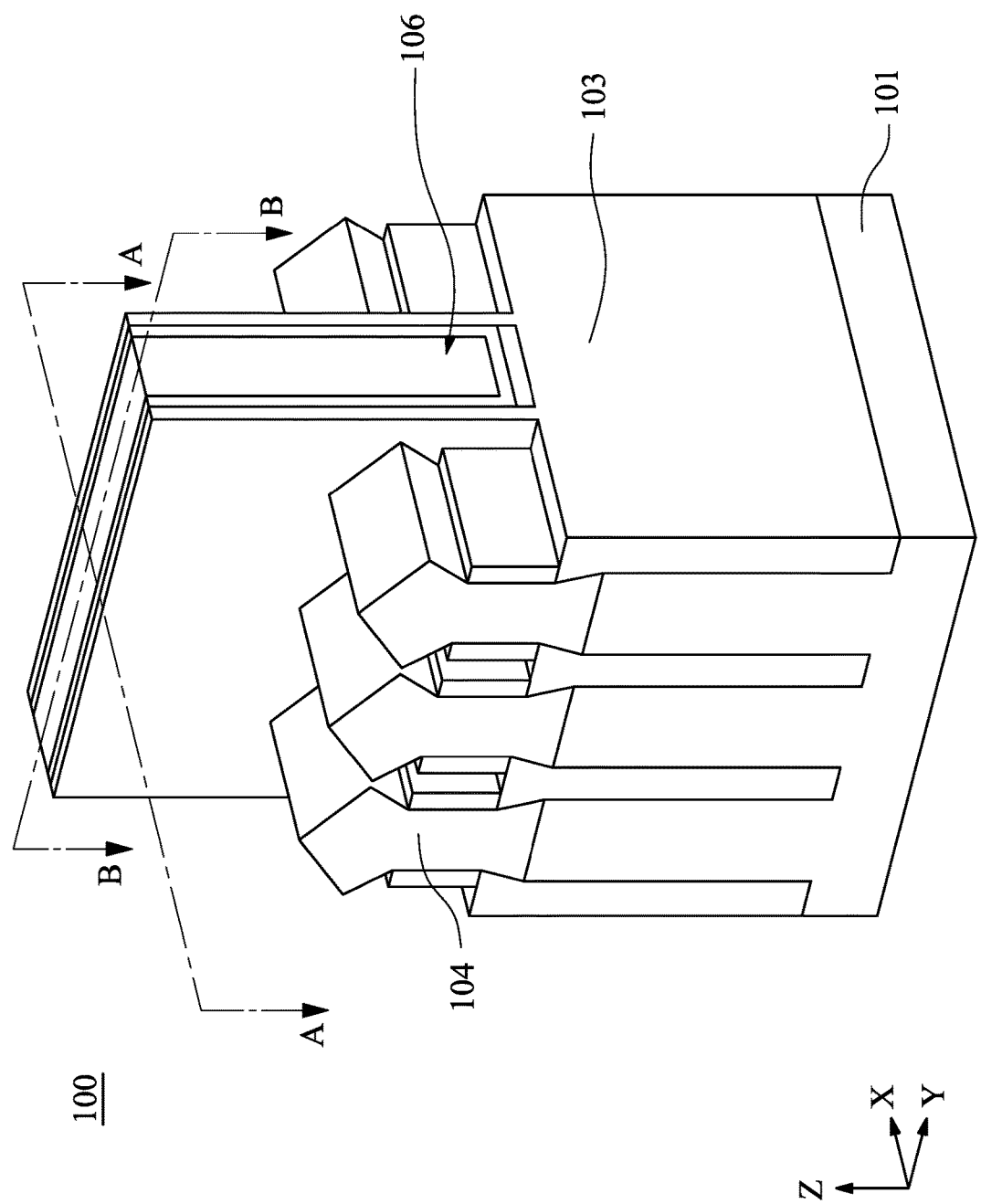
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of one of the various stages of manufacturing a semiconductor device structure 100, in accordance with some embodiments. As shown in FIG. 1, the semiconductor device structure 100 includes a substrate 101 having at least a plurality of devices formed thereover. The devices, such as transistors, diodes, imaging sensors, resistors, capacitors, inductors, memory cells, a combination thereof, and/or other suitable devices, may be formed on the substrate 101. In some embodiments, the interconnection structures may be formed on or below the devices.

Figure 2B:
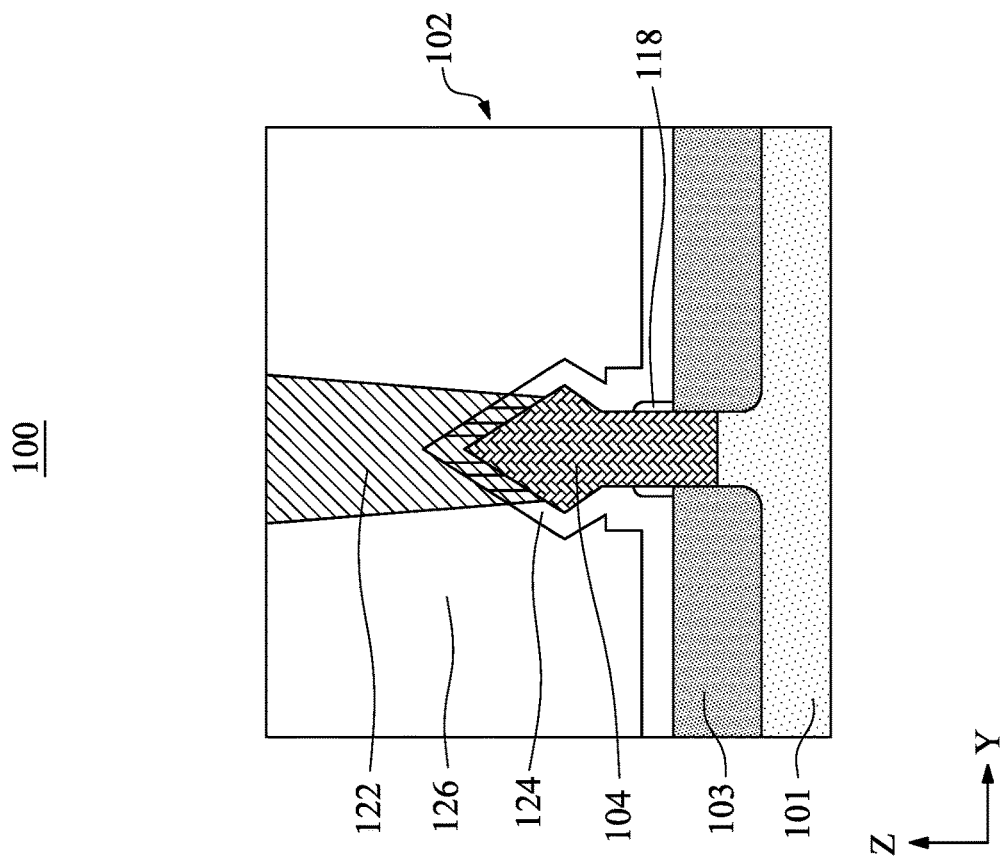
FIGS. 2A-2B are cross-sectional side views of one of various stages of manufacturing a semiconductor device structure, in accordance with some embodiments.
Figure 2A:
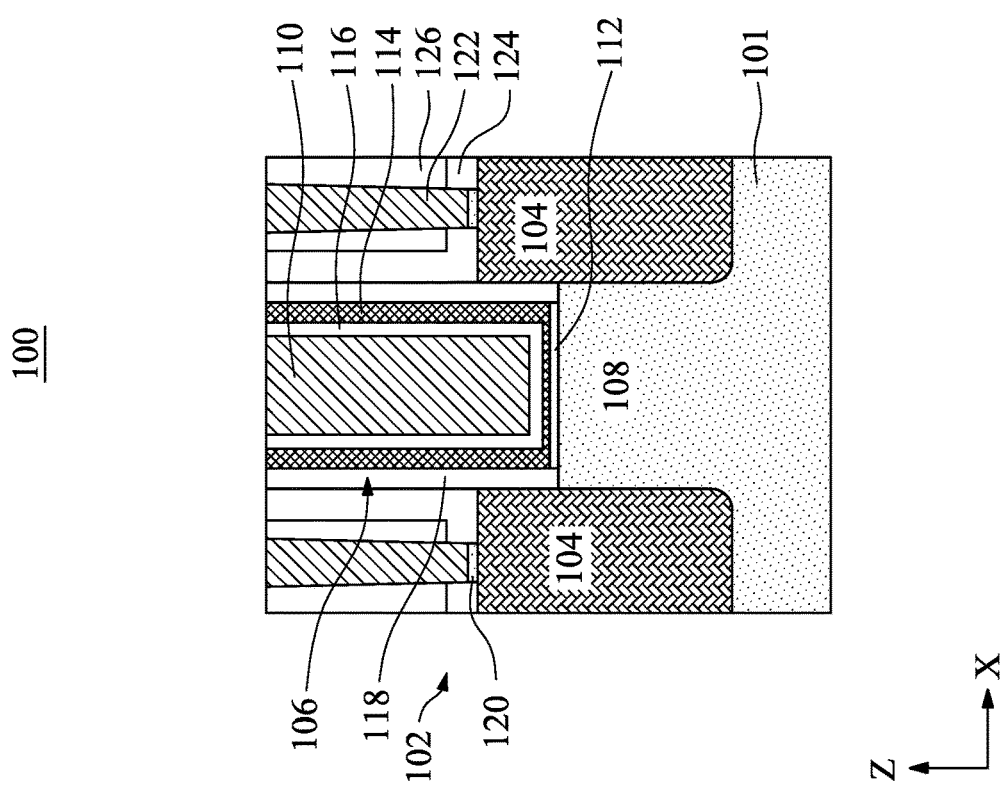

FIGS. 2A-2B are cross-sectional side views of various stages of manufacturing the semiconductor device structure 100, in accordance with some embodiments. FIG. 2A is a cross-sectional side view of the semiconductor device structure 100 taken along line A-A of FIG. 1, and FIG. 2B is a cross-sectional side view of the semiconductor device structure 100 taken along line B-B of FIG. 1. The line A-A of FIG. 1 extends along a direction that is substantially perpendicular to the longitudinal direction of a gate stack 106, and the line B-B of FIG. 1 extends along the longitudinal direction of the gate stack 106. As shown in FIGS. 2A and 2B, the semiconductor device structure 100 includes the substrate 101, and one or more devices 102 are formed on the substrate 101. The interconnection structures may be formed over the devices 102.

The substrate 101 may be a semiconductor substrate. In some embodiments, the substrate 101 includes a crystalline semiconductor layer on at least the surface of the substrate 101. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). In some embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxygen-containing material, such as an oxide.

The substrate 101 may include various regions that have been suitably doped with impurities (e.g., p-type or n-type impurities). The dopants are, for example phosphorus for an n-type fin field effect transistor (FinFET) and boron for a p-type FinFET.

As described above, the devices 102 may be any suitable devices, such as transistors, diodes, imaging sensors, resistors, capacitors, inductors, memory cells, or a combination thereof. In some embodiments, the devices 102 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 102 formed between the substrate 101 and the interconnection structures (such as the interconnection structure 200 shown in FIG. 3A-3L or 4A-4D) may be a FinFET or a nanostructure, which is shown in FIGS. 2A and 2B. An exemplary device 102 may include source/drain (S/D) regions 104 and a gate stack 106 disposed between the S/D regions 104 serving as source regions and the S/D regions 104 serving as drain regions. While there is only one gate stack 106 formed on the substrate 101, it is contemplated that two or more gate stacks 106 may also be formed on the substrate 101. Channel regions 108 are formed between the S/D regions 104 serving as source regions and the S/D regions 104 serving as drain regions.

The S/D regions 104 may include a semiconductor material, such as Si or Ge, a III-V compound semiconductor, an II-VI compound semiconductor, or other suitable semiconductor material. Exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 104 may include p-type dopants, such as boron; n-type dopants, such as phosphorus or arsenic; and/or other suitable dopants including combinations thereof. The S/D regions 104 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 101. In some embodiments, the devices 102 are FinFETs, and the channel regions 108 are a plurality of fins each having at least three surfaces wrapped around by the gate stack 106. In some other embodiments, the devices 102 are nanosheet transistors, and the channel regions 108 include two or more nanosheets surrounded by the gate stack 106.

Each gate stack 106 includes a gate electrode layer 110 disposed over the channel region 108 or partially/fully surrounding the channel region 108. The gate electrode layer 110 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 106 may include an interfacial dielectric layer 112, a gate dielectric layer 114 disposed on the interfacial dielectric layer 112, and one or more conformal layers 116 disposed on the gate dielectric layer 114. The gate electrode layer 110 may be disposed on the conformal layers 116. The interfacial dielectric layer 112 may include a dielectric material, such as an oxygen-containing material or a nitrogen-containing material, or multilayers thereof, and may be formed by any suitable deposition method, such as CVD, PECVD, or ALD. The gate dielectric layer 114 may include a dielectric material such as an oxygen-containing material or a nitrogen-containing material, a high-k dielectric material having a k value greater than that of silicon dioxide, or multilayers thereof. The gate dielectric layer 114 may be formed by any suitable method, such as CVD, PECVD, or ALD. The conformal layers 116 may include one or more barrier layers and/or capping layers, such as a nitrogen-containing material, for example tantalum nitride (TaN), titanium nitride (TiN), or the like. The conformal layers 116 may further include one or more work-function layers, such as aluminum titanium carbide, aluminum titanium oxide, aluminum titanium nitride, or the like. The term "conformal" may be used herein for ease of description upon a layer having substantial same thickness over various regions. The conformal layers 116 may be deposited by ALD, PECVD, MBD, or any suitable deposition technique.

One or more gate spacers 118 are formed along sidewalls of the gate stack 106 (e.g., sidewalls of the gate dielectric layers 114). The gate spacers 118 may include silicon oxycarbide, silicon nitride, silicon oxynitride, silicon carbon nitride, the like, multi-layers thereof, or a combination thereof, and may be deposited by CVD, PVD, ALD, or other suitable deposition technique.

Portions of the gate stacks 106 and the gate spacers 118 may be formed on isolation regions 103. The isolation regions 103 are formed on the substrate 101. The isolation regions 103 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 103 includes silicon oxide that is formed by a FCVD process.

A contact etch stop layer (CESL) 124 is formed on a portion of the S/D regions 104 and the isolation region 103, and a first interlayer dielectric (ILD) 126 is formed on the CESL 124. The CESL 124 can provide a mechanism to stop an etch process when forming openings in the first ILD 126. The CESL 124 may be conformally deposited on surfaces of the S/D regions 104 and the isolation regions 103. The CESL 124 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, PVD, ALD, or any suitable deposition technique. The first ILD 126 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 120 is formed on at least a portion of each S/D region 104, as shown in FIGS. 2A and 2B. The silicide layer 120 may include a material having one or more of WSi, CoSi, NiSi, TiSi, MoSi and TaSi. In some embodiments, the silicide layer 120 includes a metal or metal alloy silicide, and the metal includes a noble metal, a refractory metal, a rare earth metal, alloys thereof, or combinations thereof. A conductive contact 122 is disposed on each silicide layer 120. The conductive contact 122 may include a material having one or more of Ru, Mo, Co, Ni. W, Ti, Ta, Cu, Al, TiN or TaN, and the conductive contact 122 may be formed by any suitable method, such as electro-chemical plating (ECP), or PVD. The silicide layer 120 and the conductive contact 122 may be formed by first forming an opening in the first ILD 126 and the CESL 124 to expose at least a portion of the S/D region 104, then forming the silicide layer 120 on the exposed portion of the S/D region 104, and then forming conductive contact 122 on the silicide layer 120.

Figure 5:
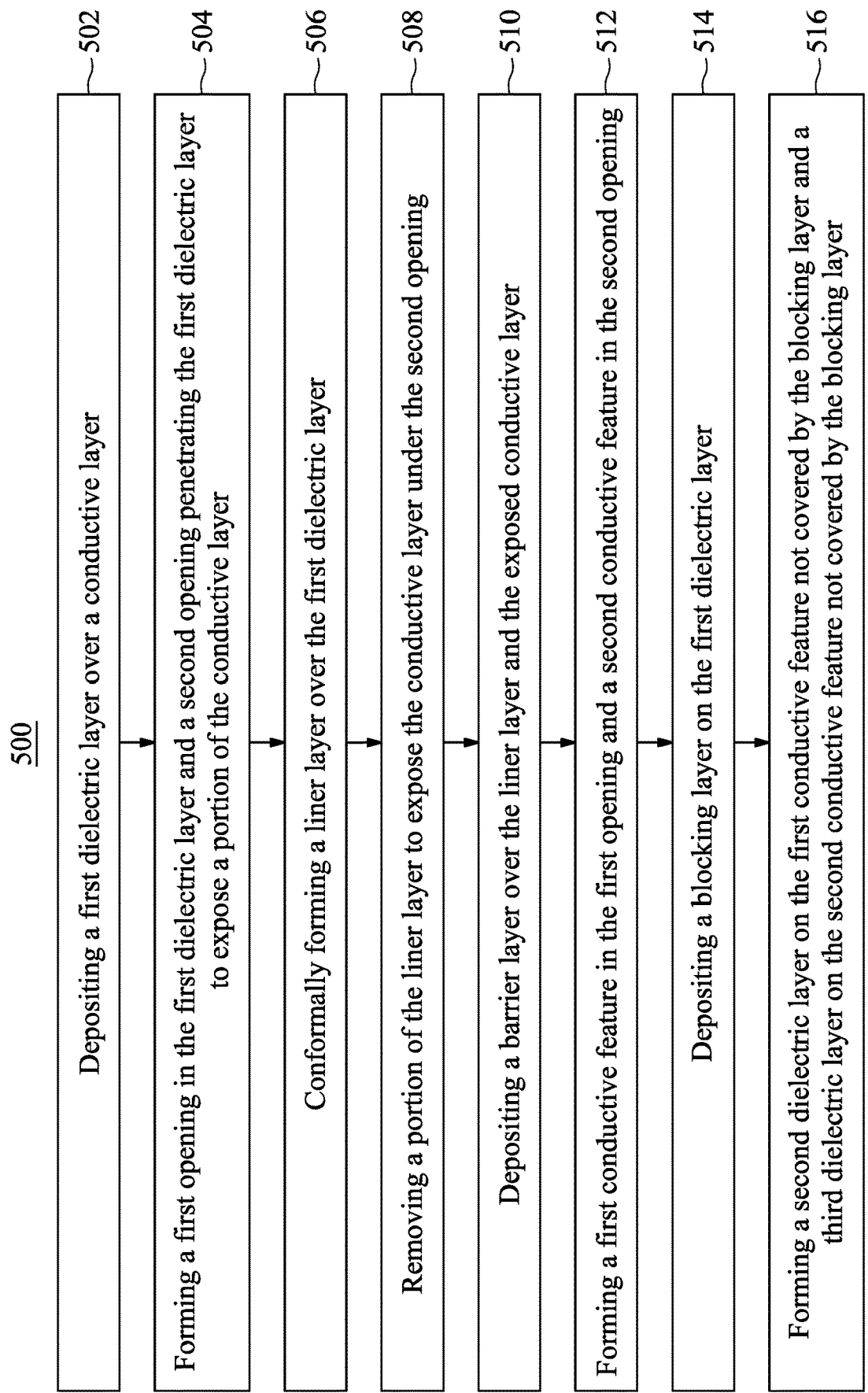
FIG. 5 is a flow chart of a method for manufacturing a semiconductor interconnection structure in accordance with some embodiments.

FIGS. 3A-3L are cross-sectional side views of various stages of manufacturing a semiconductor structure 300, including an interconnection structure 301, in accordance with some embodiments. In some embodiments, the interconnection structure 301 may be formed on or below the semiconductor device structure 100. FIG. 5 is a flow chart of a method 500 for manufacturing the interconnection structure 301 in accordance with some embodiments. For the purpose of better describing the present disclosure, the cross-sectional side view of the semiconductor structure 300 in FIGS. 3A-3L and the method 500 in FIG. 5 will be discussed together. It is understood that the operations shown in the method 500 are not exhaustive and that other operations may be performed as well before, after, or between any of the illustrated operations. Further, some of the operations may be performed simultaneously, or in a different order than shown in FIGS. 3A-3L and FIG. 5.

Figure 3A:
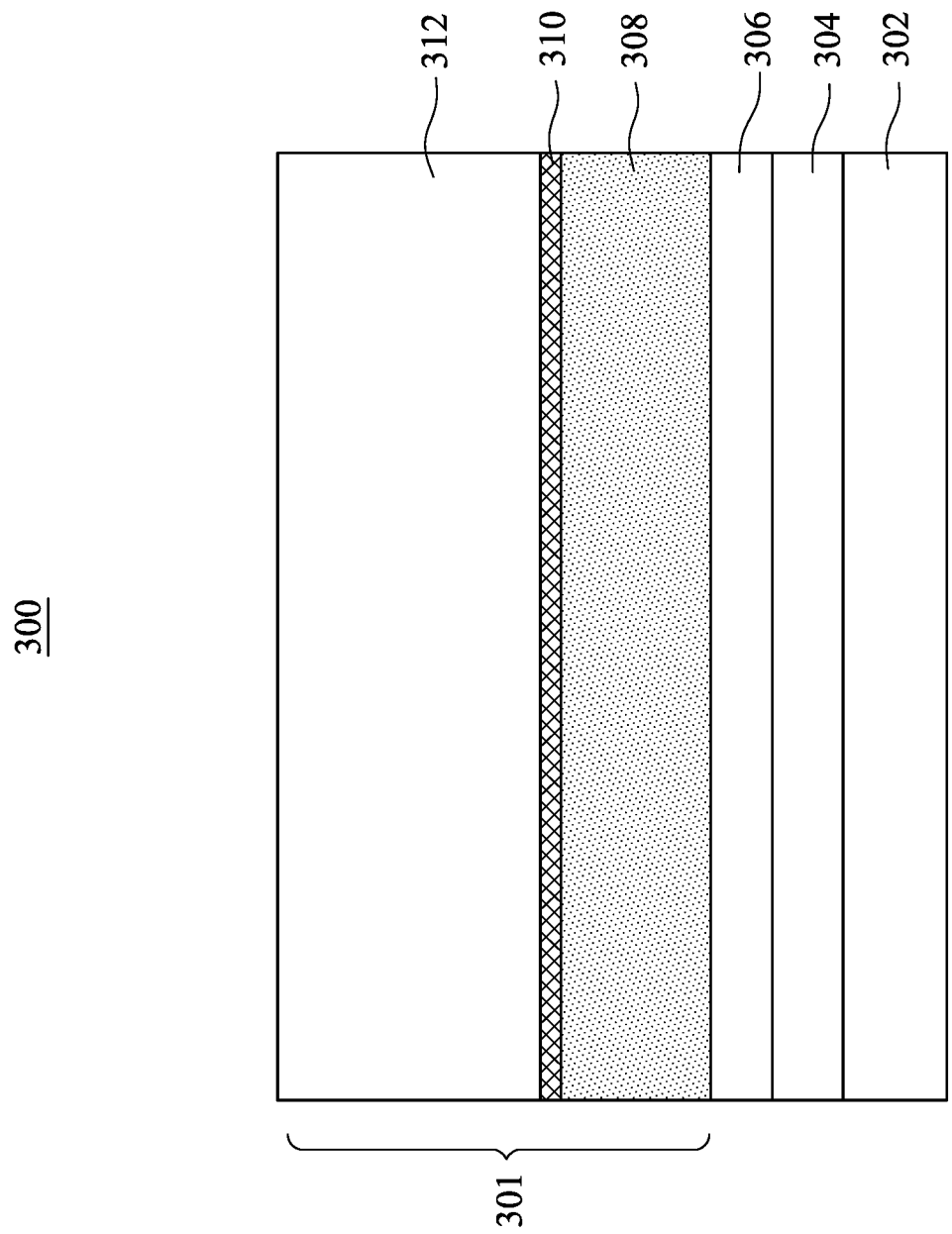
FIGS. 3A-3L are cross-sectional side views of various stages of manufacturing a semiconductor structure, in accordance with some embodiments.

As shown in FIG. 3A, a semiconductor substrate 302 is provided. The semiconductor substrate 302 may be similar to substrate 101 discussed above. A plurality of devices 304 and a middle end of the line (MEOL) structure 306 may be formed on the semiconductor substrate 302. In some embodiments, the plurality of devices 304 may be the devices 102 shown in FIGS. 2A and 2B.

In the MEOL structure 306, low level interconnects (contacts), such as the conductive contacts 122 shown in FIGS. 2A and 2B, are formed over the S/D regions 104 and the gate electrode layer 110. The MEOL structure 306 may have smaller critical dimensions and may be spaced closer together compared to a later formed back end of the line (BEOL) counterparts. A purpose of the contact layers of the MEOL structure 306 is to electrically connect the various regions of the transistors, i.e., the source/drain and metal gate electrode, to higher level interconnects in the BEOL.

As shown in FIG. 3A and operation 502 in FIG. 5, a conductive layer 308 is formed over the MEOL structure 306, an etch stop layer (ESL) 310 may be formed over the conductive layer 308, and a dielectric layer 312 is formed over the ESL 310. In some embodiments, the conductive layer 308 may be a conductive layer of other interconnection structures of the semiconductor structure 300. In some embodiments, the conductive layer 308 may be a conductive layer above the MEOL structure 306. In some embodiments, the conductive layer 308 may include Cu, Al, CuAl, Ru, Mo, W, and related alloys formed in a dielectric material (not shown). In some embodiments, the conductive layer 308 may be formed by ALD, CVD, PVD, electroless deposition (ELD), ECP, or other suitable processes.

In some embodiments, the ESL 310 may be used to control the etching depth in the dielectric layer 312 and serve as an etch stop when forming a later formed conductive feature in the dielectric layer 312. In some embodiments, the ESL 310 may include SiNx, SiCxNy, AlNx, AlOx, AOxNy, SiOx, SiCx, SiOxCy, or other suitable materials. In some embodiments, the ESL 310 may be formed by CVD, PVD, ALD, spin coating, or other suitable processes. In some embodiments, the dielectric layer 312 may include or be made of porous SiCOH, dense SiCOH, BN, BC, or other suitable materials. In some embodiments, the dielectric layer 312 may formed by PECVD, ALD, PVD, or other suitable processes.

Figure 3B:
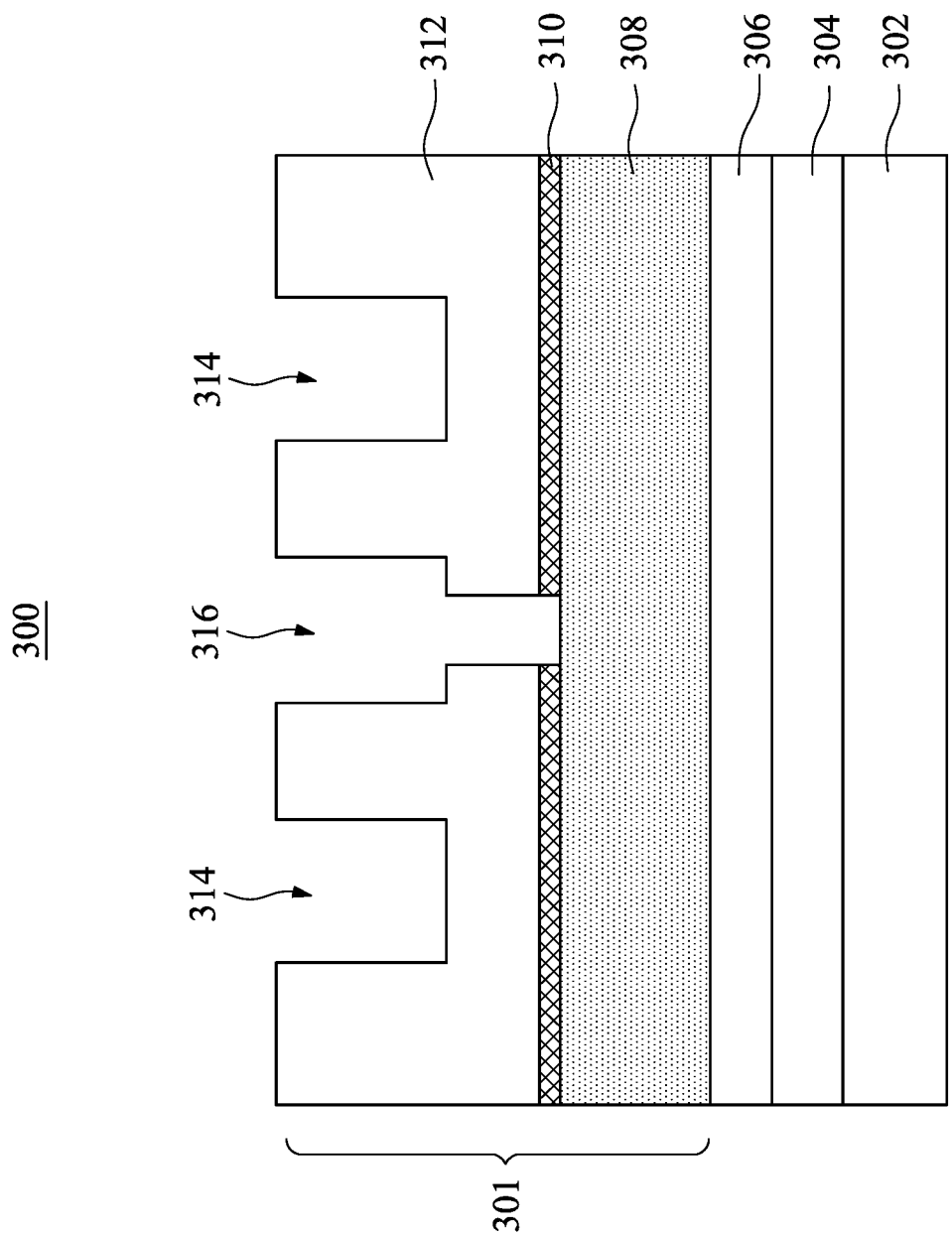

As shown in FIG. 3B and operation 504 in FIG. 5, a first opening 314 and a second opening 316 are formed in the dielectric layer 312. The first opening 314 is formed in the dielectric layer 312, and the second opening 316 penetrates the dielectric layer 312 to expose a portion of the conductive layer 308. In some embodiments, the first opening 314 and the second opening 316 may be formed by dry etch, wet etch, or other suitable processes. In some embodiments, the first opening 314 may include a trench formed in the dielectric layer 312. In some embodiments, the second opening 316 may include a via and a trench formed sequentially in the dielectric layer 312 to expose a portion of the conductive layer 308. In some embodiments, the trench of the first opening 314 and the trench of the second opening 316 may be formed first, and then the via of the second opening 316 may be formed under the trench of the second opening 316 to expose a portion of the conductive layer 308. In some embodiments, the via of the second opening 316 may be formed first penetrating the dielectric layer 312 and the ESL 310 to expose a portion of the conductive layer 308, and the trench of the first opening 314 and the trench of the second opening 316 may be formed thereafter.

Figure 3C:
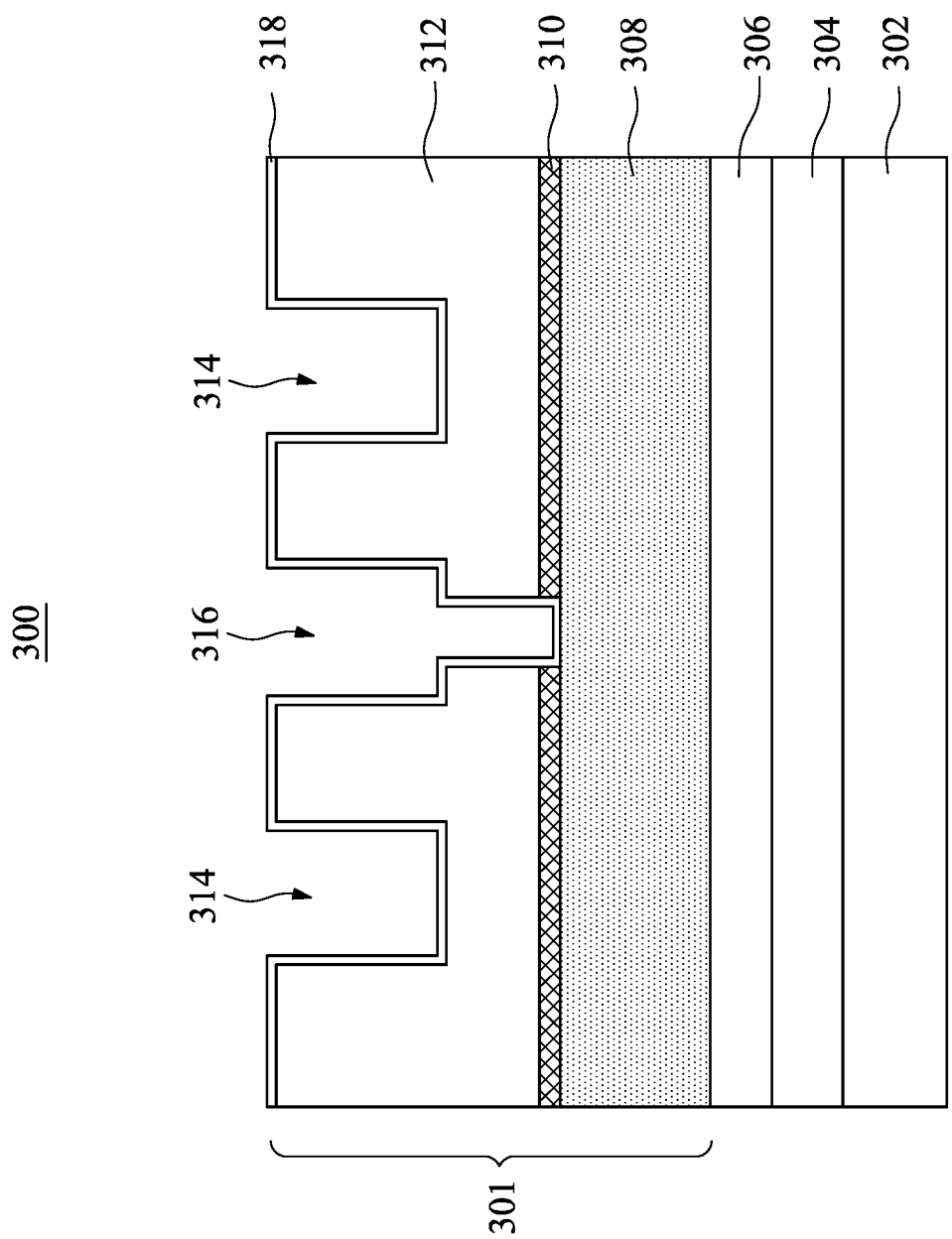

As shown in FIG. 3C and operation 506 in FIG. 5, a liner layer 318 is conformally formed over the dielectric layer 312. The liner layer 318 may cover the top surface of the dielectric layer 312, the first opening 314, and the second opening 316 including the exposed surface of the conductive layer 308. In some embodiments, the liner layer 318 may include metal oxide, metal nitride, silicon oxide doped carbide (ODS), or other suitable materials. In some embodiments, the liner layer 318 may include AlOx, ZrOx, YOx, AlNx, TiNx, SiNx, SiCxNy, ODS, or other suitable materials. In some embodiments, the liner layer 318 may have a thickness between 5 Angstroms and 40 Angstroms. In some embodiments, the liner layer 318 may be formed by PECVD, ALD, PVD, or other suitable processes. The liner layer 318 may prevent the damage on sidewalls of the later formed barrier layer or conductive materials during a later etch process.

Figure 3D:
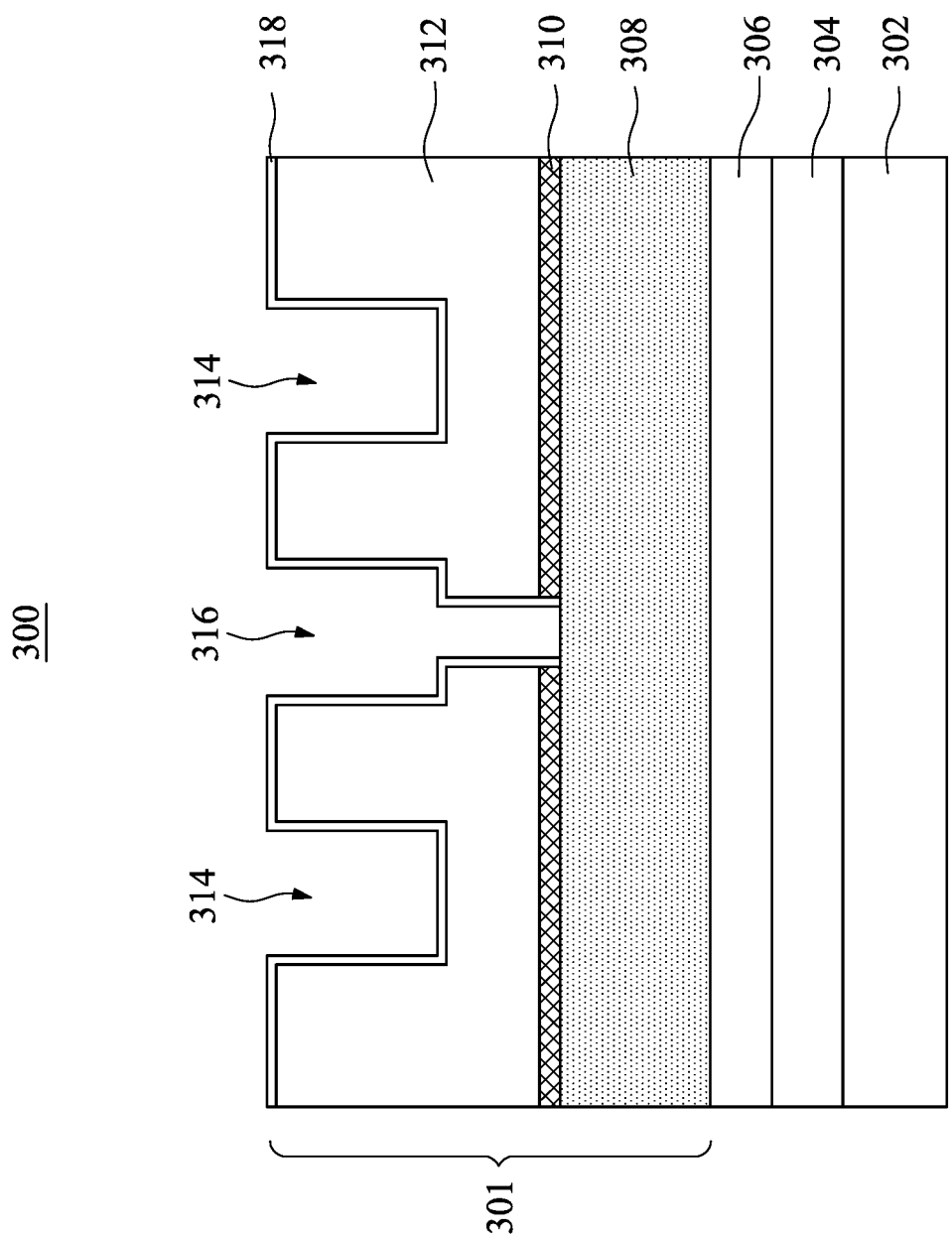

As shown in FIG. 3D and operation 508 in FIG. 5, a portion of the liner layer 318 that covers the conductive layer 308 is removed. In other words, the liner layer 318 at the bottom of the opening 316 is removed to expose the conductive layer 308. In some embodiments, the removal of the portion of the liner layer 318 may be performed by dry etch, or other suitable processes.

Figure 3E:
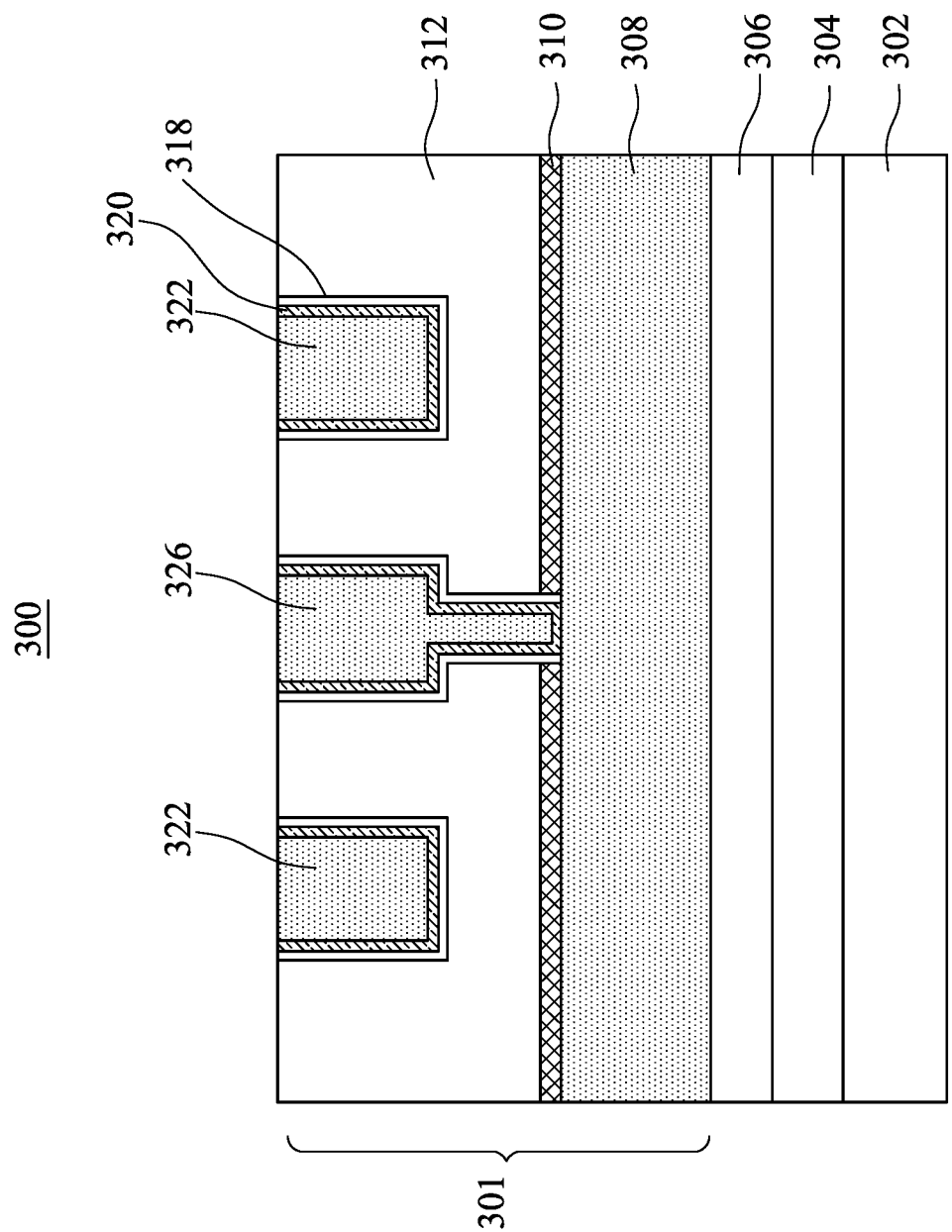

Then, as shown in FIG. 3E and operation 510 in FIG. 5, a barrier layer 320 is deposited over the liner layer 318 and the exposed conductive layer 308. In some embodiments, the barrier layer 320 may be conformally formed over the liner layer 318. In other words, the barrier layer 320 may cover not only the liner layer 318 but also the exposed conductive layer 308 at the bottom of the second opening 316. In some embodiments, the barrier layer 320 may include TaN, TiN, or other suitable materials. In some embodiments, the barrier layer 320 may have a thickness between 10 Angstroms and 30 Angstroms. In some embodiments, the barrier layer 320 may be formed by thermal ALD, or other suitable processes.

Then, as shown in FIG. 3E and operation 512 in FIG. 5, a first conductive feature 322 is formed in the first opening 314, and a second conductive feature 326 is formed in the second opening 316. A conductive material may be deposited over the barrier layer 320 and fills the first opening 314 and the second opening 316. Then, a planarization operation, e.g., chemical mechanical polishing (CMP), may be performed so that the first conductive feature 322 and the second conductive feature 326 are formed, as shown in FIG. 3E.

Figure 3F:
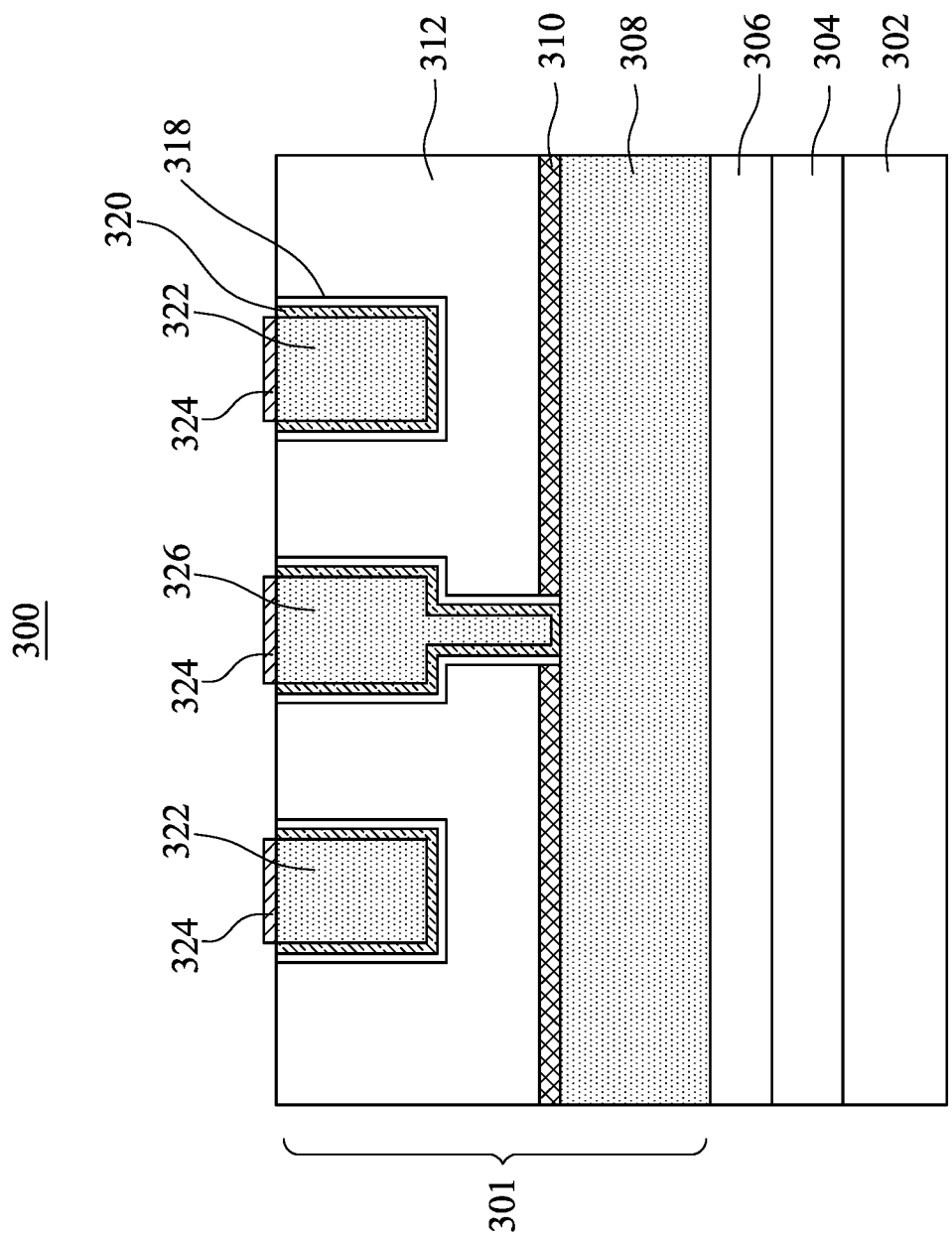

In some embodiments, the first conductive feature 322 and the second conductive feature 326 may include Cu, Al, CuAl, Ru, Mo, W, and related alloys. In some embodiments, the first conductive feature 322 and the second conductive feature 326 may be formed by ALD, CVD, PVD, ELD, ECP, or other suitable processes. The liner layer 318 is disposed between the first conductive feature 322 and the dielectric layer 312 and between the second conductive feature 326 and the dielectric layer Then, as shown in FIG. 3F, a capping layer 324 is formed on the first conductive feature 322 and the second conductive feature 326. In some embodiments, the capping layer 324 may include Cobalt (Co), or other suitable materials. In some embodiments, the capping layer 324 may be formed by CVD, ALD, or other suitable processes.

In some embodiments, the capping layer 324 is selectively formed on the first conductive feature 322 and the second conductive feature 326 but not on the dielectric layer 312. In some embodiments, before the formation of the capping layer 324, a pretreatment operation may be performed to clean the surfaces of the first conductive feature 322 and the second conductive feature 326. For example, a wet clean process may be performed to remove copper oxide on top surfaces of the first conductive feature 322 and the second conductive feature 326, some post CMP residue on the dielectric layer 312, and/or organic contamination from the CMP on the dielectric layer 312, the first conductive feature 322 and the second conductive feature 326.

In some embodiments, the capping layer 324 may be formed by CVD process with Co precursor and $H_2$. In some embodiments, the first conductive feature 322 and the second conductive feature 326 may include copper (Cu). For example, during the CVD process, $H_2$ strips the dicarbonyl groups from the Co precursor resulting in cobaltocene plus $H_2$. The Cu surfaces of the first conductive feature 322 and the second conductive feature 326 then bond with the hydrogen. Then, the cobaltocene replaces the hydrogen on the surfaces of the first conductive feature 322 and the second conductive feature 326 and forms Co capping layer (the capping layer 324) on the first conductive feature 322 and the second conductive feature 326. In some embodiments, the capping layer 324 may be formed by CVD, ALD, or other suitable processes.

Figure 3G:
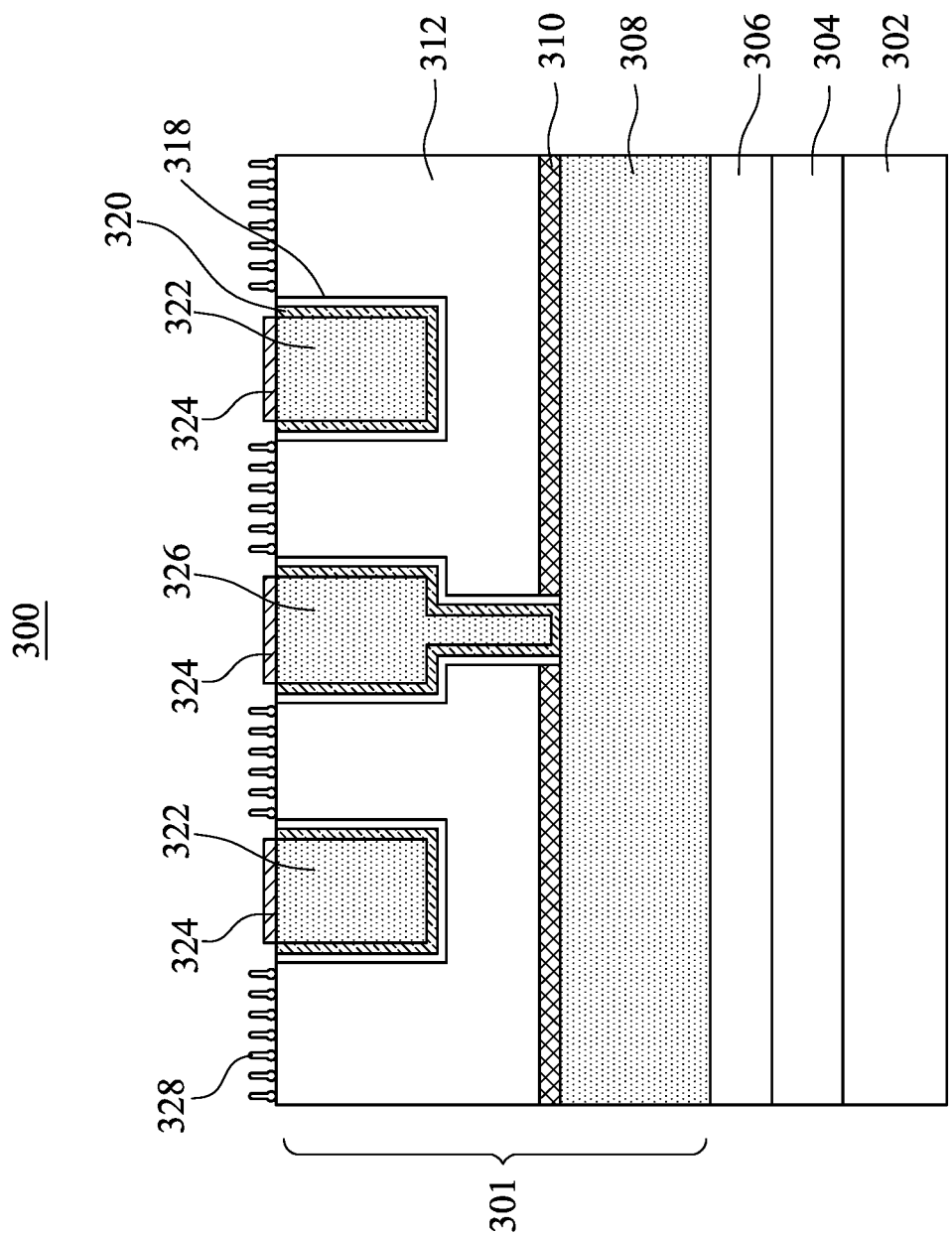

As shown in FIG. 3G and operation 514 in FIG. 5, a blocking layer 328 is formed on the dielectric layer 312. In some embodiments, the blocking layer 328 is formed by molecules with silicon-based function groups, and therefore the blocking layer 328 is formed on the dielectric layer 312, e.g., low k materials, but not on the capping layer 324, e.g., Co. For example, the blocking layer 328 may include a head group connected to a function group by way of a molecular chain. The head group is configured to adhere to preferred surfaces such as the surface of the dielectric layer 312 while not adhering to other surfaces such as the surfaces of the capping layer 324. In some embodiments, the head group may include butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, any combination of the foregoing, or the like. In some embodiments, the function group may include a hydrophobic interfacial property that repels dielectric material, thereby preventing dielectric material from adhering to the blocking layer 328, in a later dielectric on metal (DoM) process. In some embodiments, the function group may include a methyl group, which provides the hydrophobic interfacial property. In some embodiments, the blocking layer 328 may be formed by a wet process, such as dip coating, spin coating, spraying coating, or other suitable processes.

Figure 3H:
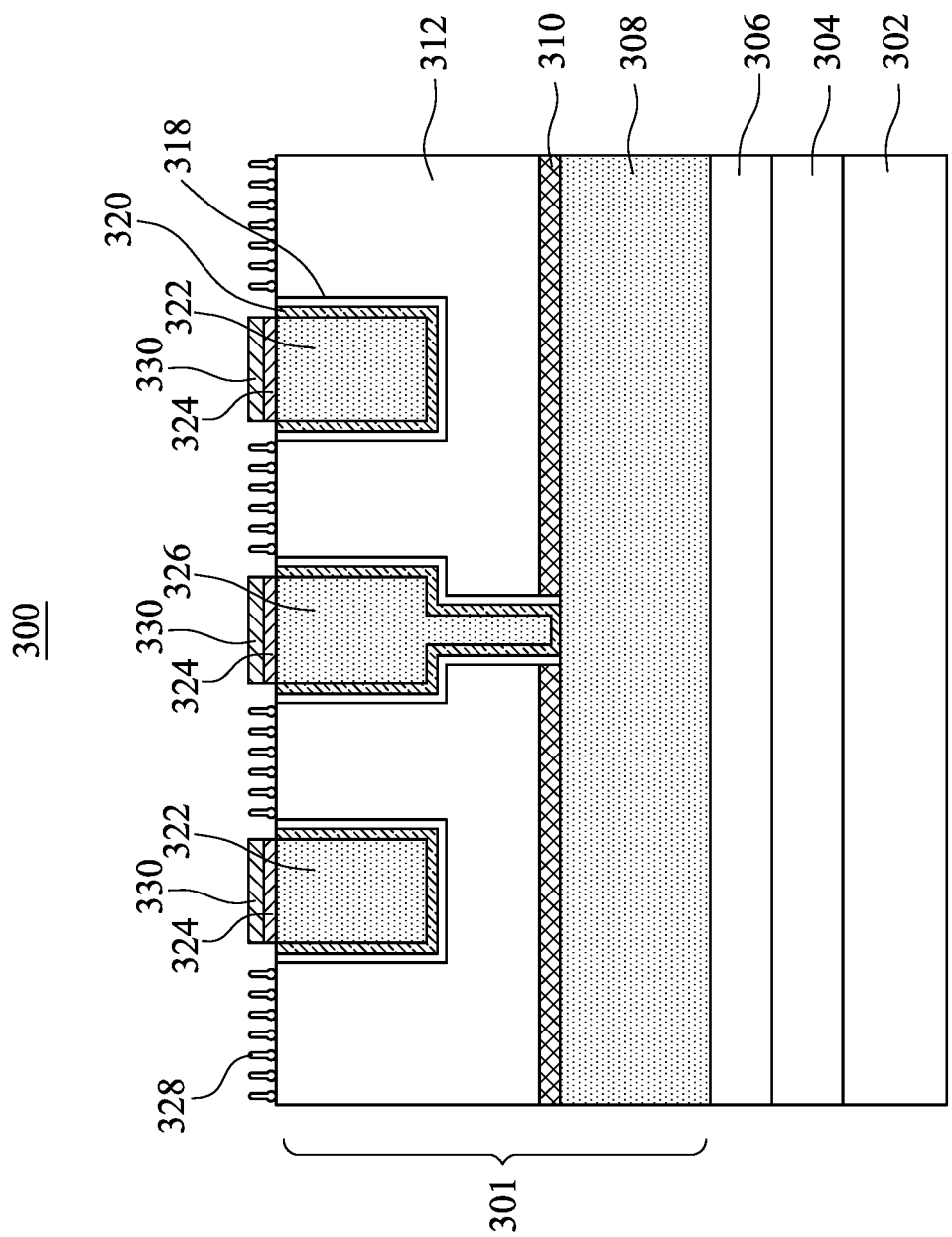

As shown in FIG. 3H and operation 516 in FIG. 5, a dielectric layer 330 is formed on the capping layer 324. In some embodiments, the dielectric layer 330 may include metal oxide, metal nitride, or other suitable materials. In some embodiments, the dielectric layer 330 may be formed by thermal ALD, or other suitable processes. In some embodiments, the dielectric layer 330 may be formed by DoM selective deposition. As described above, because of the function group of the blocking layer 328 prevents dielectric material from adhering to the blocking layer 328. The dielectric layer 330 is formed only on the capping layer 324. In some embodiments, the dielectric layer 330 may prevent damage to the below layers, such as the capping layer 324, the first conductive feature 322, and the second conductive feature 326, during subsequent processing steps.

Figure 3I:
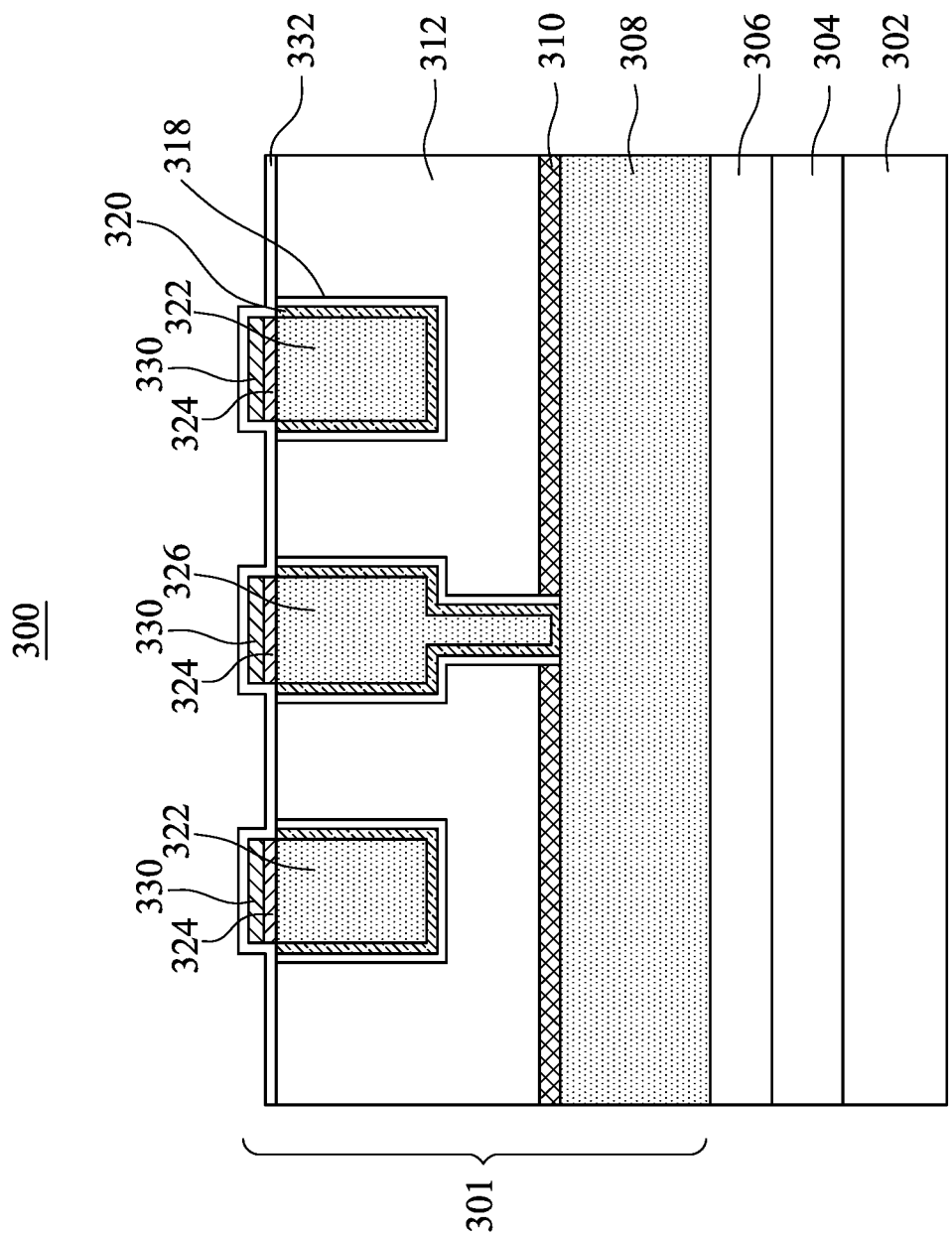
Figure 3J:
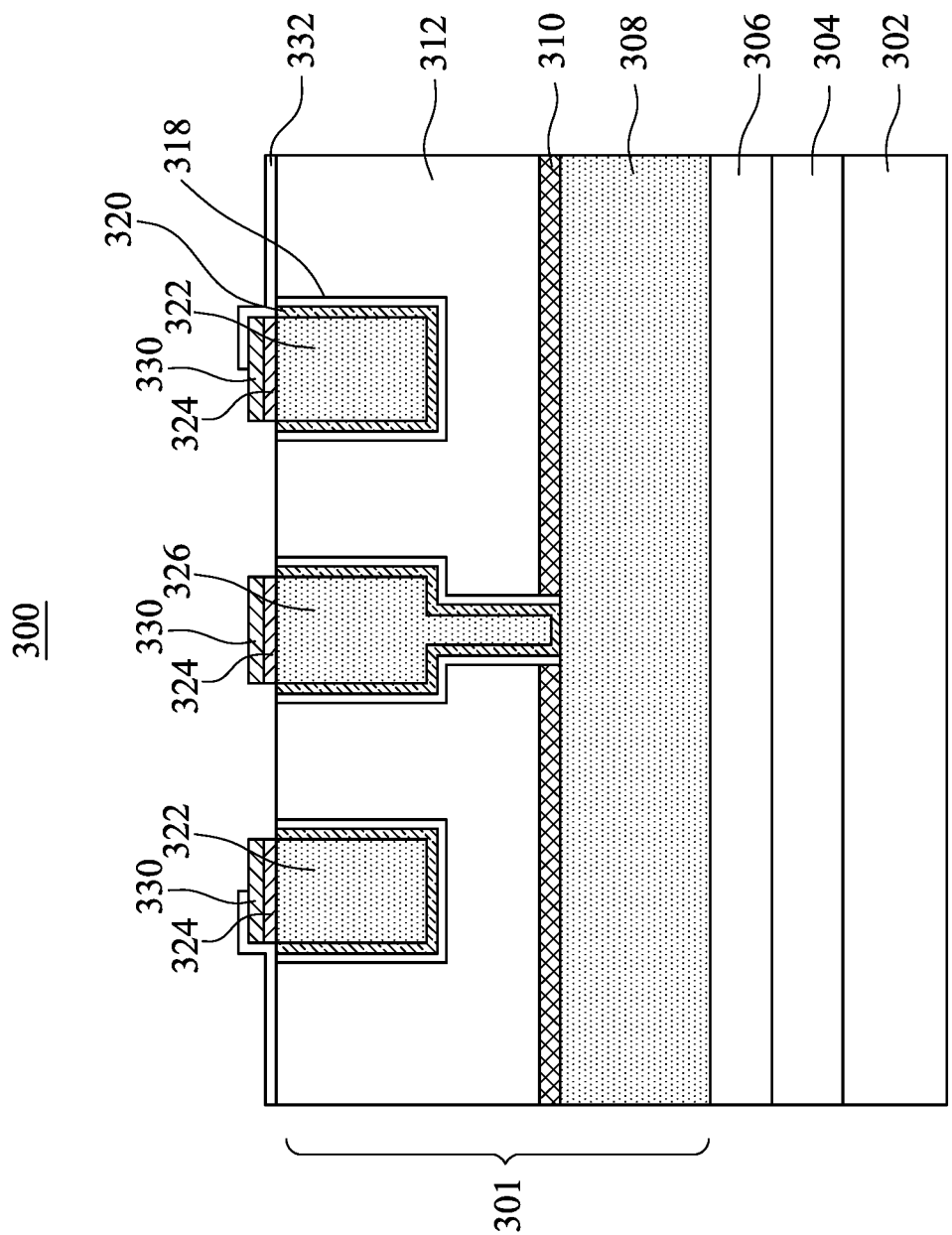

As shown in FIG. 3I, the blocking layer 328 is removed and an ESL 332 is conformally formed over the dielectric layer 312, the liner layer 318, the barrier layer 320, and the dielectric layer 330. In some embodiments, the ESL 332 may be formed by PVD, CVD, PECVD, ALD, plasma enhanced ALD (PEALD), or other suitable processes. In some embodiments, the ESL 332 may include silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another dielectric material, or other suitable materials. In some embodiments, the ESL 332 may have a thickness between 5 Angstroms and 200 Angstroms. Then, as shown in FIG. 3J, a portion of the ESL 332 is removed to expose portions of the dielectric layer 312.

Figure 3K:
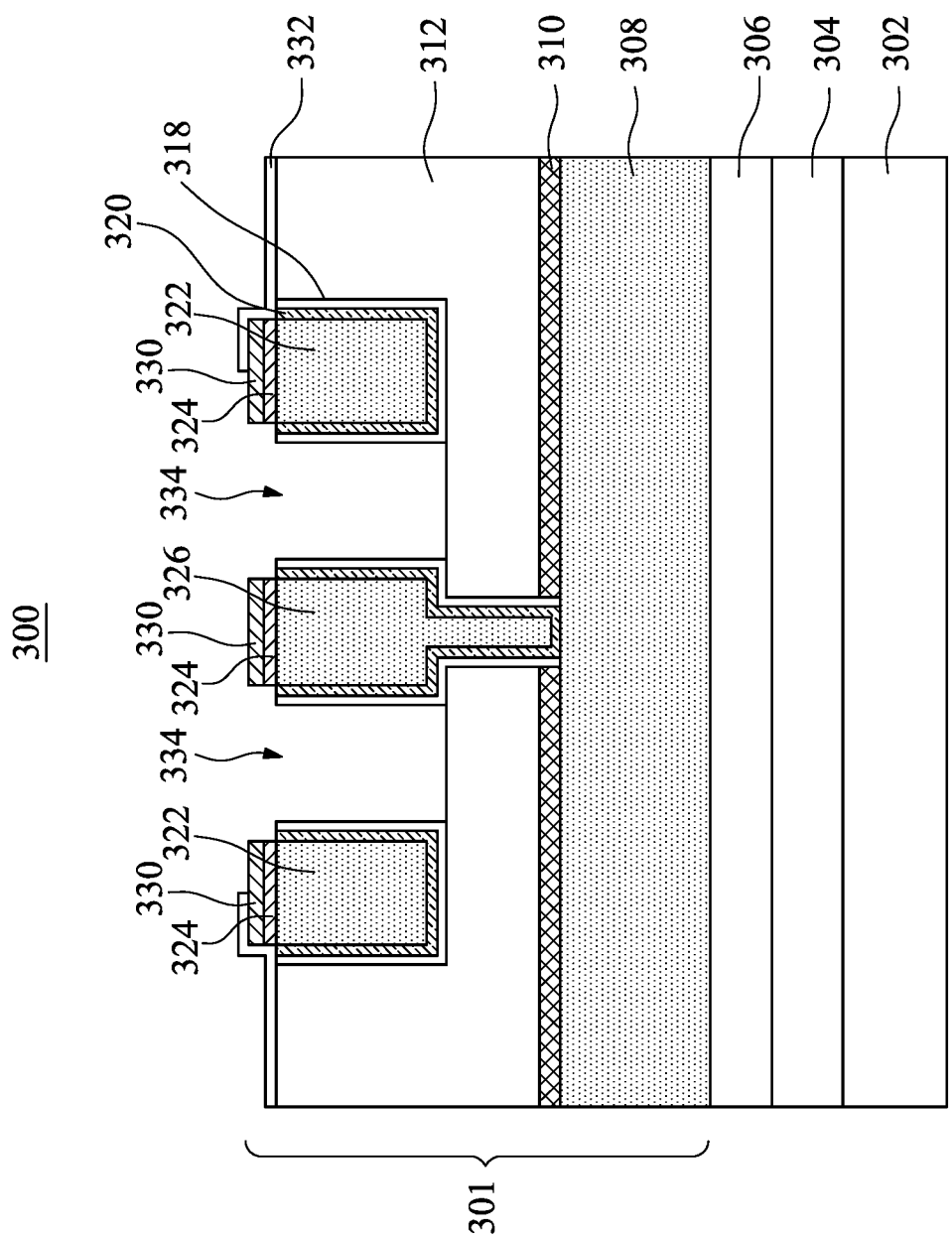

As shown in FIG. 3K, a third opening 334 is formed in the dielectric layer 312 between the first conductive feature 322 and the second conductive feature 326. In some embodiments, an etch operation is performed on the ESL 332, the dielectric layer 312, the liner layer 318, the barrier layer 320, and the dielectric layer 330. In some embodiments, the etch operation may include dry etch, wet etch, or other suitable processes. Because the sidewalls of the barrier layer 320 are covered and protected by the liner layer 318, the liner layer 318 can prevent the damage on sidewalls of the barrier layer 320 during the etch operation.

Figure 3L:
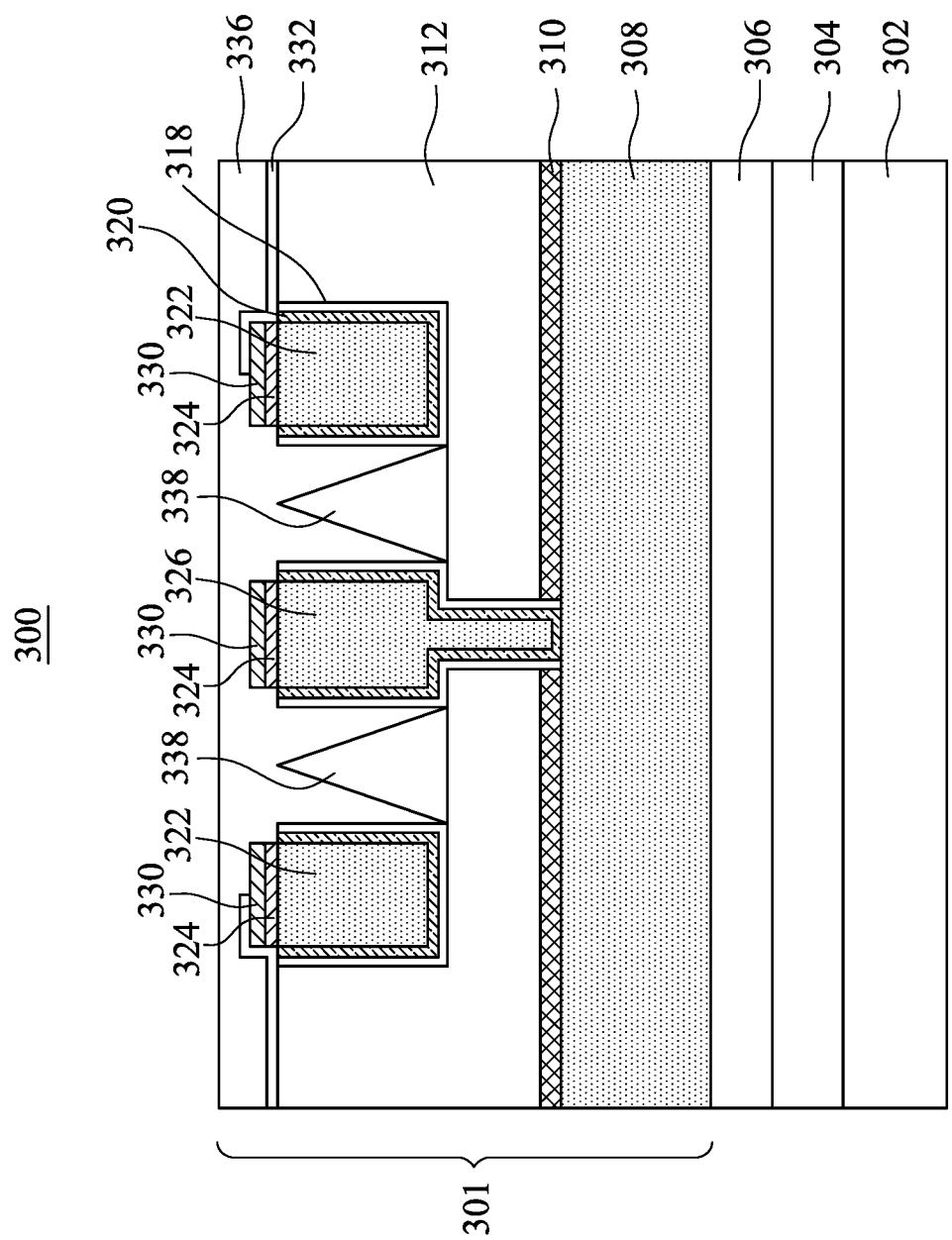

As shown in FIG. 3L, a dielectric layer 336 is formed over the third opening 334 and an air gap 338 is formed between the first conductive feature 322 and the second conductive feature 326 in the dielectric layer 336. In some embodiment, the dielectric layer 336 may partially fill the third opening 334 resulting the air gaps 338. In some embodiments, the dielectric layer 336 may be the same material as the dielectric layer 312. In some embodiments, the dielectric layer 336 may include or be made of porous SiCOH, dense SiCOH, boron nitride (BN), boron carbide (BC), or other suitable materials. In some embodiments, the dielectric layer 336 may formed by PECVD, ALD, PVD, or other suitable processes.

In some embodiments, for forming the air gap 338 in the dielectric layer 336, a non-conformal deposition process may be performed to form the dielectric layer 336 in the third opening 334 during operation 516. For example, the PECVD process may be performed to form the dielectric layer 336 in the third opening 334 and form the air gap 338 in the dielectric layer 336. In some embodiments, because of the deposition process is non-conformal, the air gap 338 may be triangle shaped or like triangle shaped, as shown in FIG. 3L. As shown in FIG. 3L, the air gap 338 is wider near a lower portion of the third opening 334 and narrower near an upper portion of the third opening 334. In some embodiments, the air gap 338 is defined by the dielectric layer 336 and the dielectric layer 312.

In some embodiments, the air gap 338 may reduce an effective dielectric constant of the dielectric layer 336. In some embodiments, the effective dielectric constant of the dielectric layer 336 may be reduced to a range between 2 and 3.6. By reducing the effective dielectric constant of the dielectric layer 336, the capacitance between the first conductive feature 322 and the second conductive feature 326 is reduced, and thereby the performance of the semiconductor structure 300 may be increased.

Figure 6:
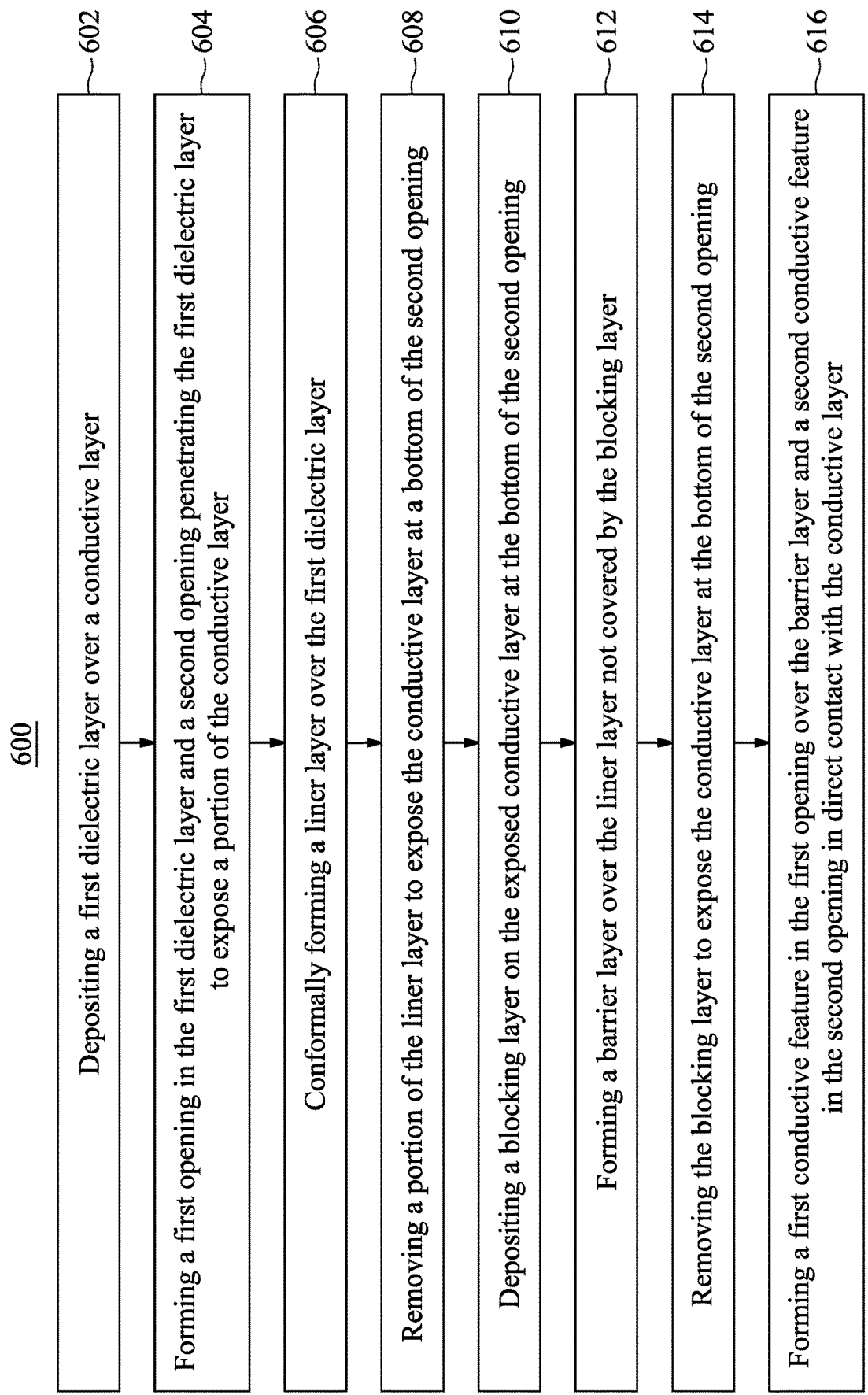
FIG. 6 is a flow chart of another method for manufacturing a semiconductor interconnection structure in accordance with some embodiments

FIGS. 4A-4G are cross-sectional side views of various stages of manufacturing another semiconductor structure 400, including an interconnection structure 401, in accordance with some embodiments. In some embodiments, the interconnection structure 401 may be formed on or below the semiconductor device structure 100. FIG. 6 is a flow chart of a method 600 for manufacturing the interconnection structure 401 in accordance with some embodiments. For the purpose of better describing the present disclosure, the cross-sectional side view of the semiconductor structure 400 in FIGS. 4A-4G and the method 600 in FIG. 6 will be discussed together. It is understood that the operations shown in the method 600 are not exhaustive and that other operations may be performed as well before, after, or between any of the illustrated operations. Further, some of the operations may be performed simultaneously, or in a different order than shown in FIGS. 4A-4G and FIG. 6.

Figure 4A:
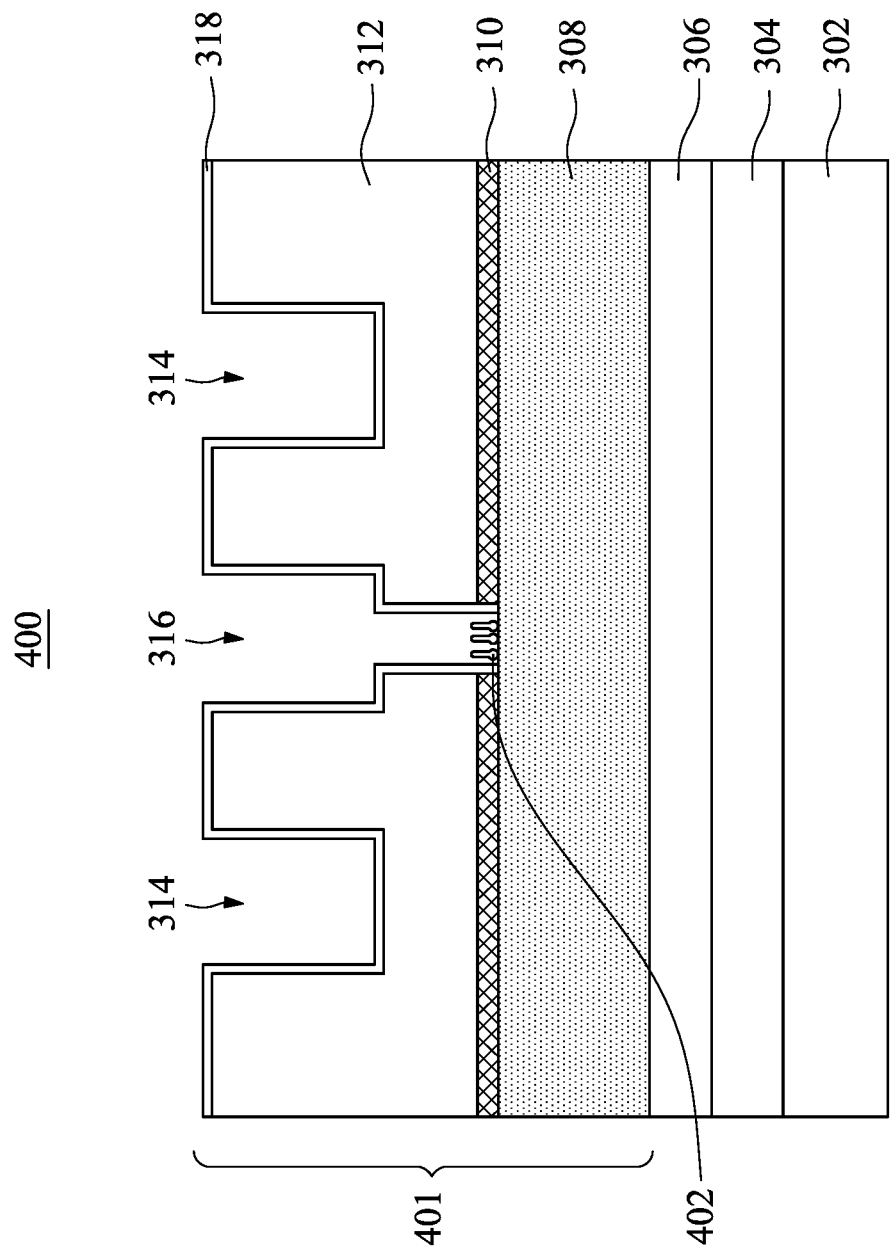
FIGS. 4A-4H are cross-sectional side views of various stages of manufacturing another semiconductor structure, in accordance with some embodiments.

As shown in FIG. 4A, the structure and manufacturing process of the semiconductor structure 400 are similar to those of the semiconductor structure 300 in FIG. 3D. In other words, the operations 602, 604, 606, and 608 in the method 600 may be similar to the operations 502, 504, 506, and 508 in the method 500. However, as shown in FIG. 4A and operation 610 in FIG. 6, after removing a portion of the liner layer 318 that covers the conductive layer 308, a blocking layer 402 is formed at the bottom of the second opening 316 on the exposed conductive layer 308.

In some embodiments, the blocking layer 402 is formed by molecules with sulfur (S) or phosphorus (P) function groups. For example, the blocking layer 402 may include a head group connected to a function group by way of a molecular chain. In some embodiments, the head group has a high affinity to the metal surface (e.g., the exposed conductive layer 308), and thus adhere and/or anchor to the exposed conductive layer 308 rather than the liner layer 318.

Figure 4B:
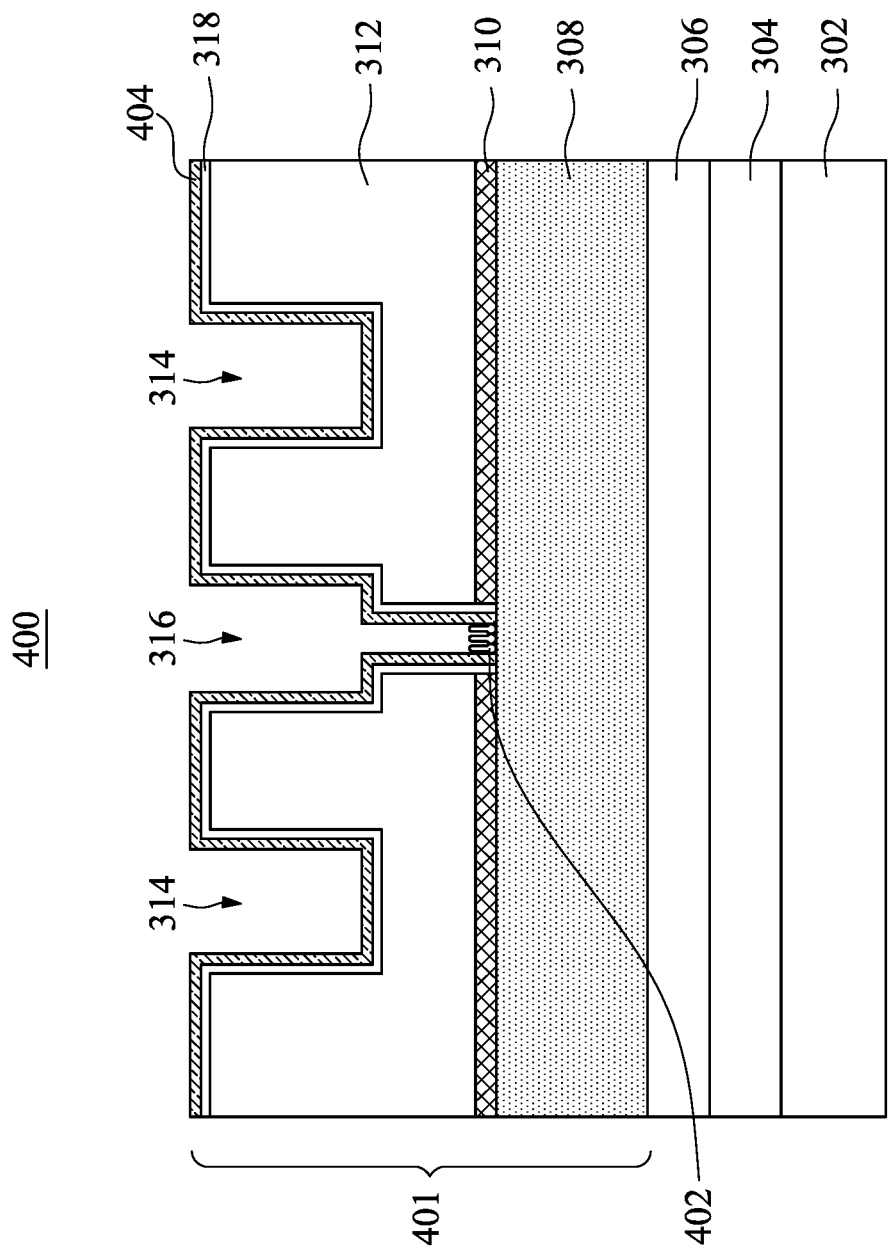

As shown in FIG. 4B and operation 612 in FIG. 6, a barrier layer 404 is formed over the liner layer 318 but not on the blocking layer 402. In some embodiments, since the blocking layer 402 is formed by molecules with S or P function groups, the S or P function group may repel the deposition of the barrier layer 404 on the blocking layer 402. In some embodiments, the barrier layer 404 may include TaN, TiN, or other suitable materials. In some embodiments, the barrier layer 404 may have a thickness between 10 Angstroms and 30 Angstroms. In some embodiments, the barrier layer 404 may be formed by thermal ALD, or other suitable processes.

Figure 4C:
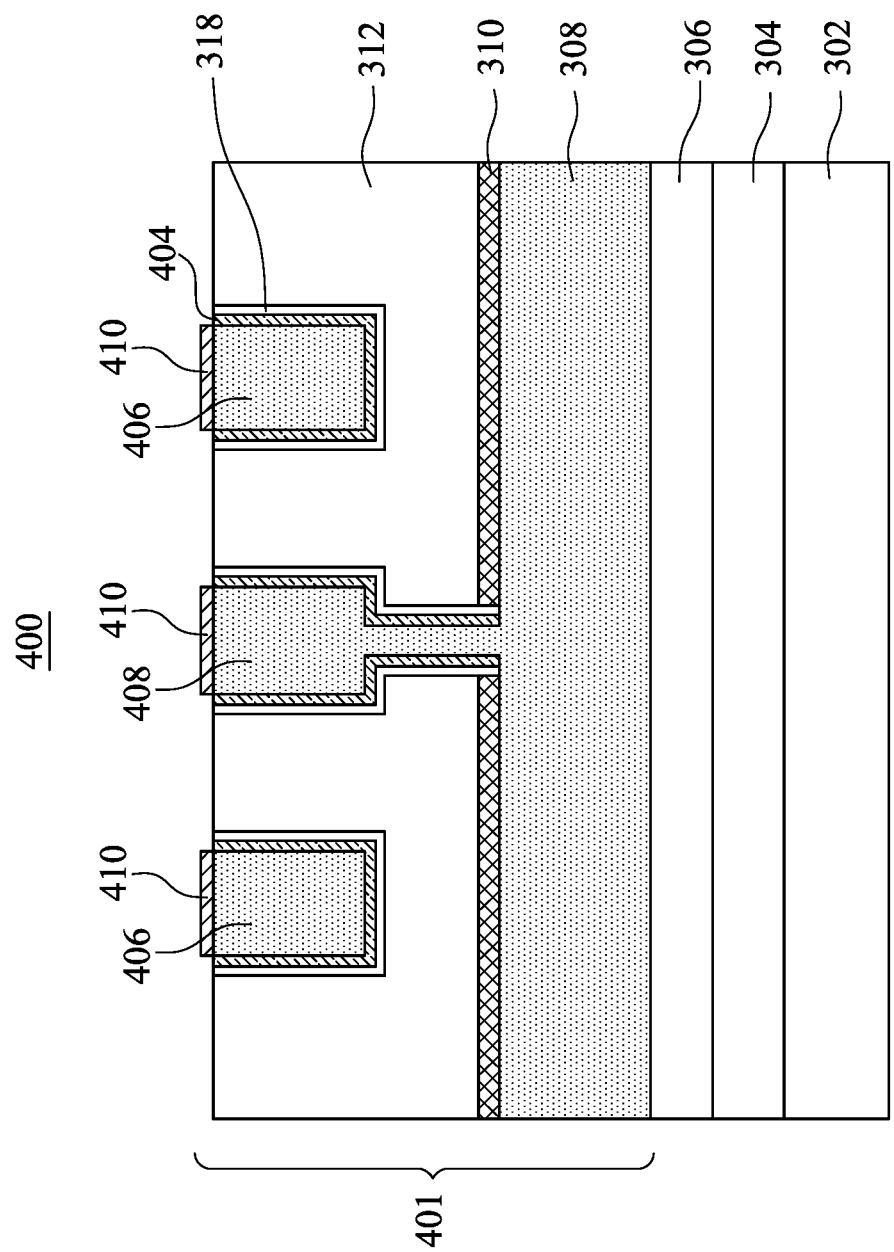

As shown in FIG. 4C and operation 614 in FIG. 6, the blocking layer 402 is removed. Then, as shown in operation 616 in FIG. 6, a first conductive feature 406, a second conductive feature 408, and a capping layer 410 are formed in the first opening 314 and the second opening 316 over the barrier layer 404. In some embodiments, the materials and the manufacturing processes of the first conductive feature 406, the second conductive feature 408, and the capping layer 410 may be similar to the materials and the manufacturing processes of the first conductive feature 322, the second conductive feature 326, and the capping layer 324. Because the blocking layer 402 prevents the formation of the barrier layer 404 at the bottom of the second opening 316, after forming the second conductive feature 408, the second conductive feature 408 can in direct contact with the conductive layer 308. Therefore, the resistance between the via structure (the second conductive feature 408) and the conductive layer 308 may be reduced.

Figure 4D:
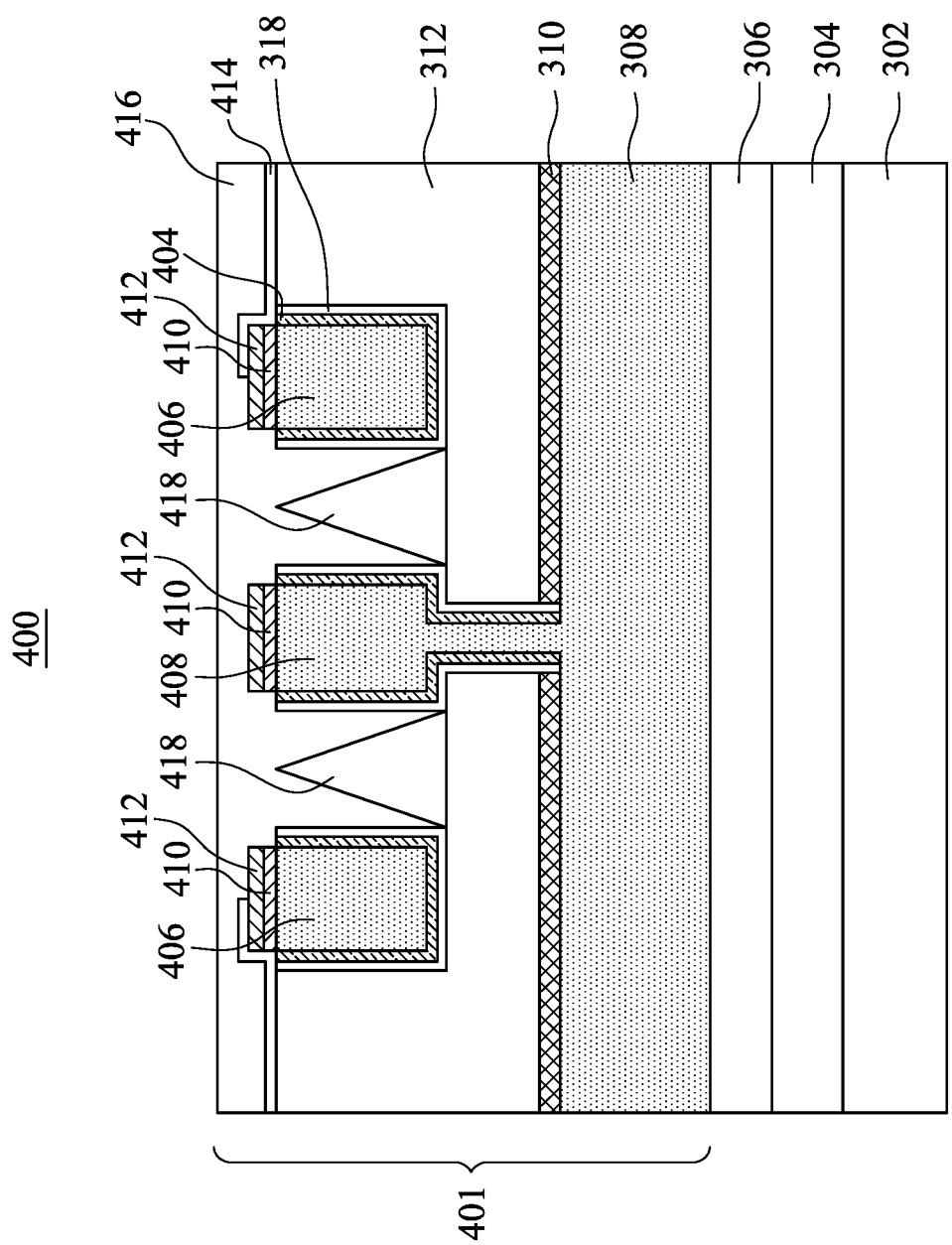

As shown in FIG. 4D, a dielectric layer 412 is formed on the capping layer 410. An ESL 414 is formed over the dielectric layer 312, the liner layer 318, the barrier layer 404, and the dielectric layer 412. A dielectric layer 416 is formed and an air gap 418 is formed between the first conductive feature 406 and the second conductive feature 408 in the dielectric layer 416. In some embodiments, the materials and the manufacturing processes of the dielectric layer 412, the ESL 414, the dielectric layer 416, and the air gap 418 may be similar to the materials and the manufacturing processes of the dielectric layer 330, the ESL 332, the dielectric layer 336, and the air gap 338 shown in FIGS. 3F-3L.

The air gap 418 may reduce an effective dielectric constant of the dielectric layer 416. In some embodiments, the effective dielectric constant of the dielectric layer 416 may be reduced to a range between 2 and 3.6. By reducing the effective dielectric constant of the dielectric layer 416, the capacitance between the first conductive feature 406 and the second conductive feature 408 is reduced, and thereby the performance of the semiconductor structure 400 may be increased.

In addition, the liner layer 318 may prevent the damage at the sidewalls of the barrier layer 404, or the first conductive feature 406 and the second conductive feature 408, during the etch process of forming the opening between the first conductive feature 406 and the second conductive feature 408. The dielectric layer 412 may prevent top side damage of the first conductive feature 406 and the second conductive feature 408 during the etch process of forming the opening between the first conductive feature 406 and the second conductive feature 408.

Furthermore, in the semiconductor structure 400, because the blocking layer 402 prevents the formation of the barrier layer 404 at the bottom of the second opening 316, the second conductive feature 408 can in direct contact with the conductive layer 308. Therefore, the resistance of the via structure may be reduced. The resistance-capacitance (RC) delay of the semiconductor structure may be further reduced.

Figure 4E:
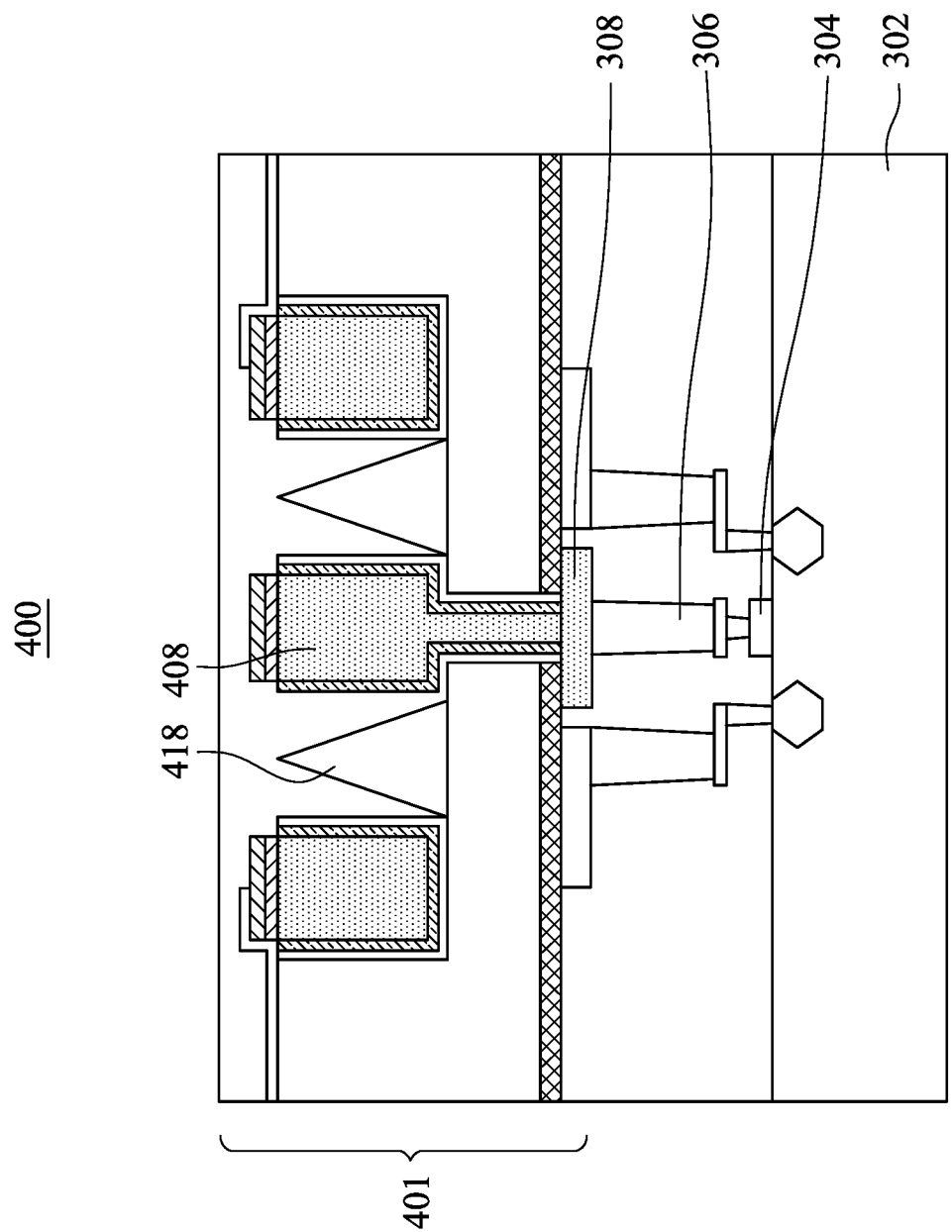

FIG. 4E illustrates an example of the semiconductor structure 400. In some embodiments, the semiconductor structure 400 may include the semiconductor substrate 302. The device 304, such as a transistor shown in FIG. 4E, may be formed on the semiconductor substrate 302. The MEOL 306 may include one or more than one conductive structure, such as one or more than one conductive layer and via, in contact with the terminals of the device 304. The interconnection structure 401 is formed on the MEOL 306.

Figure 4F:
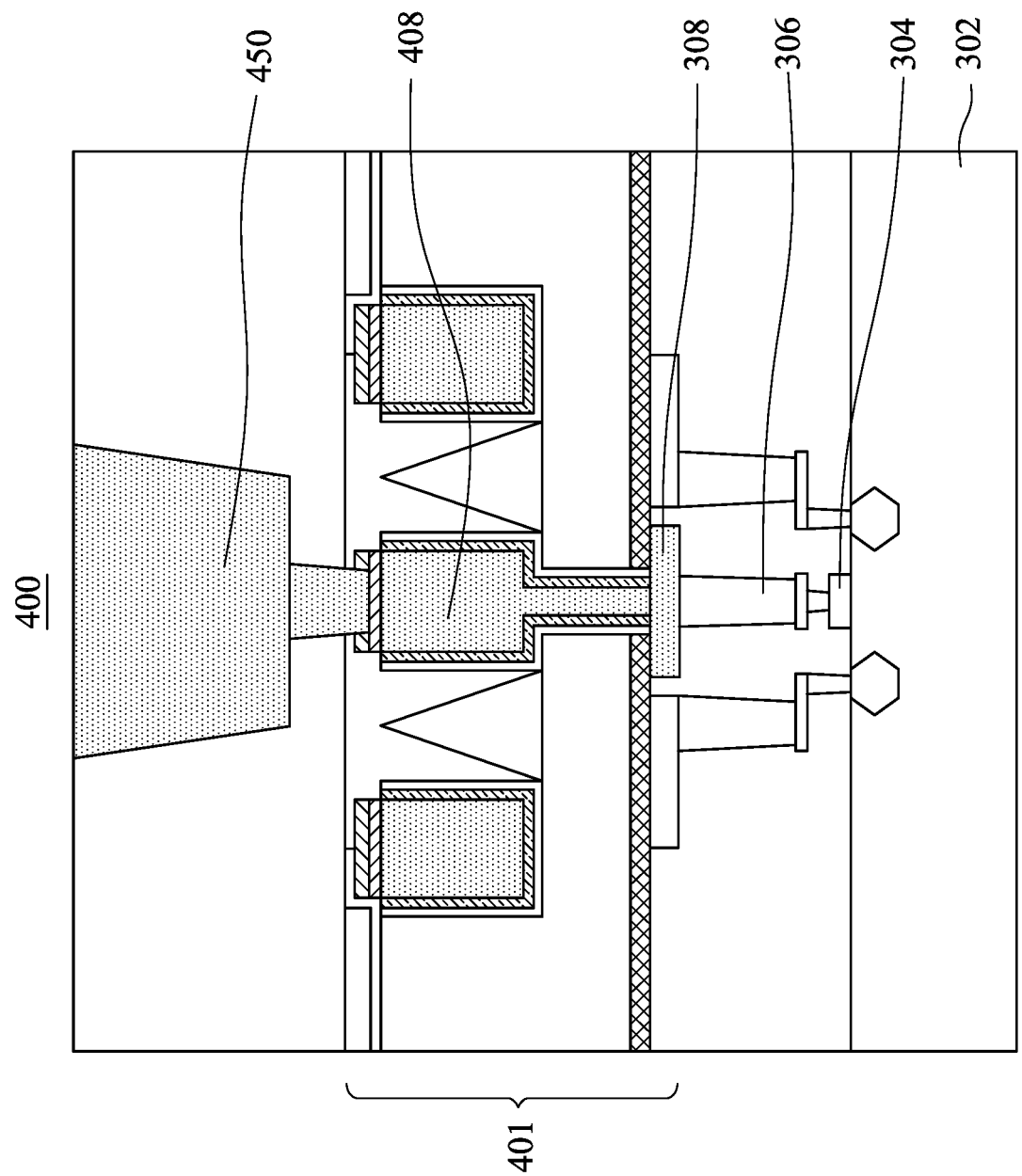
Figure 4G:
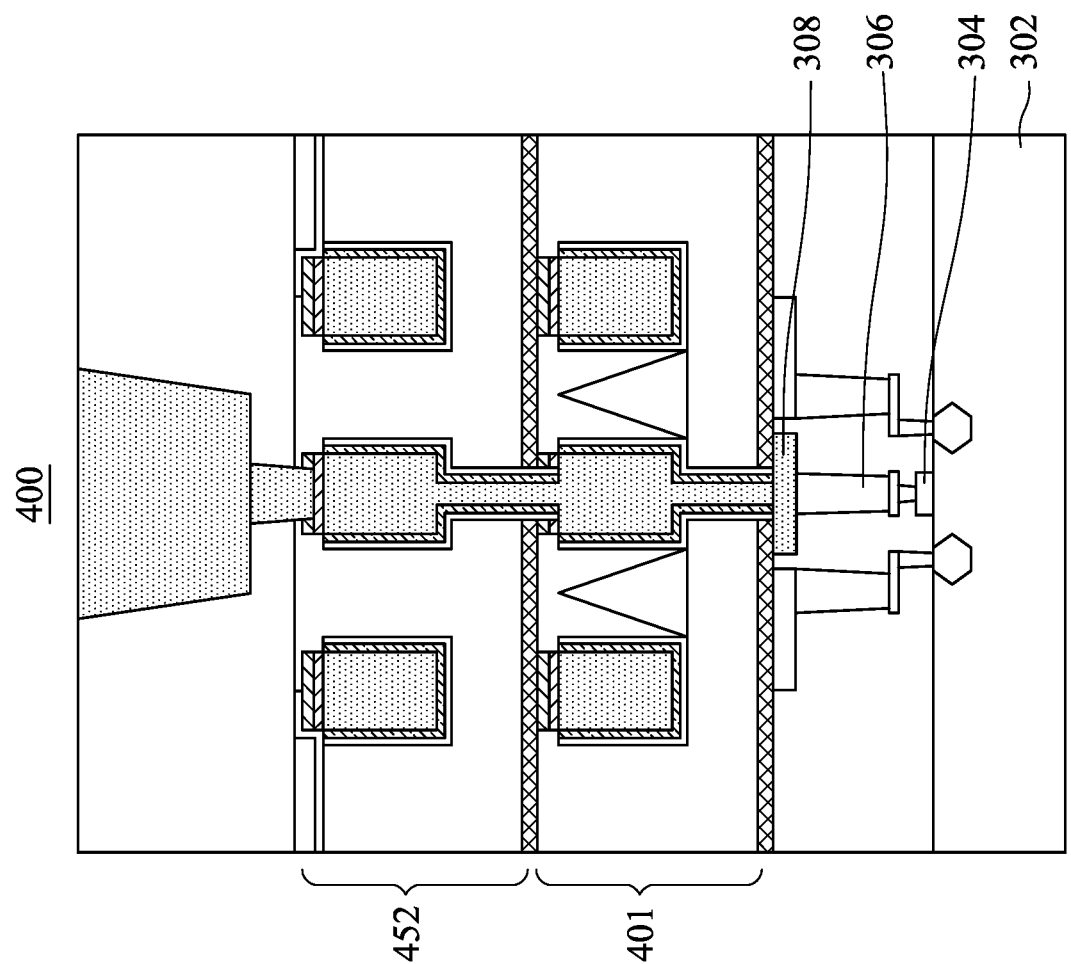

FIG. 4F illustrates another example of the semiconductor structure 400. A conductive feature 450 may be formed above the interconnection structure 401 and in electric contact with the second conductive feature 408. FIG. 4F illustrates a further example of the semiconductor structure 400. Another interconnection structure 452 may be further formed on the interconnection structure 401. Furthermore, the interconnection structure 452 may include the air gap, or without the air gap as shown in FIG. 4G.

Figure 4H:
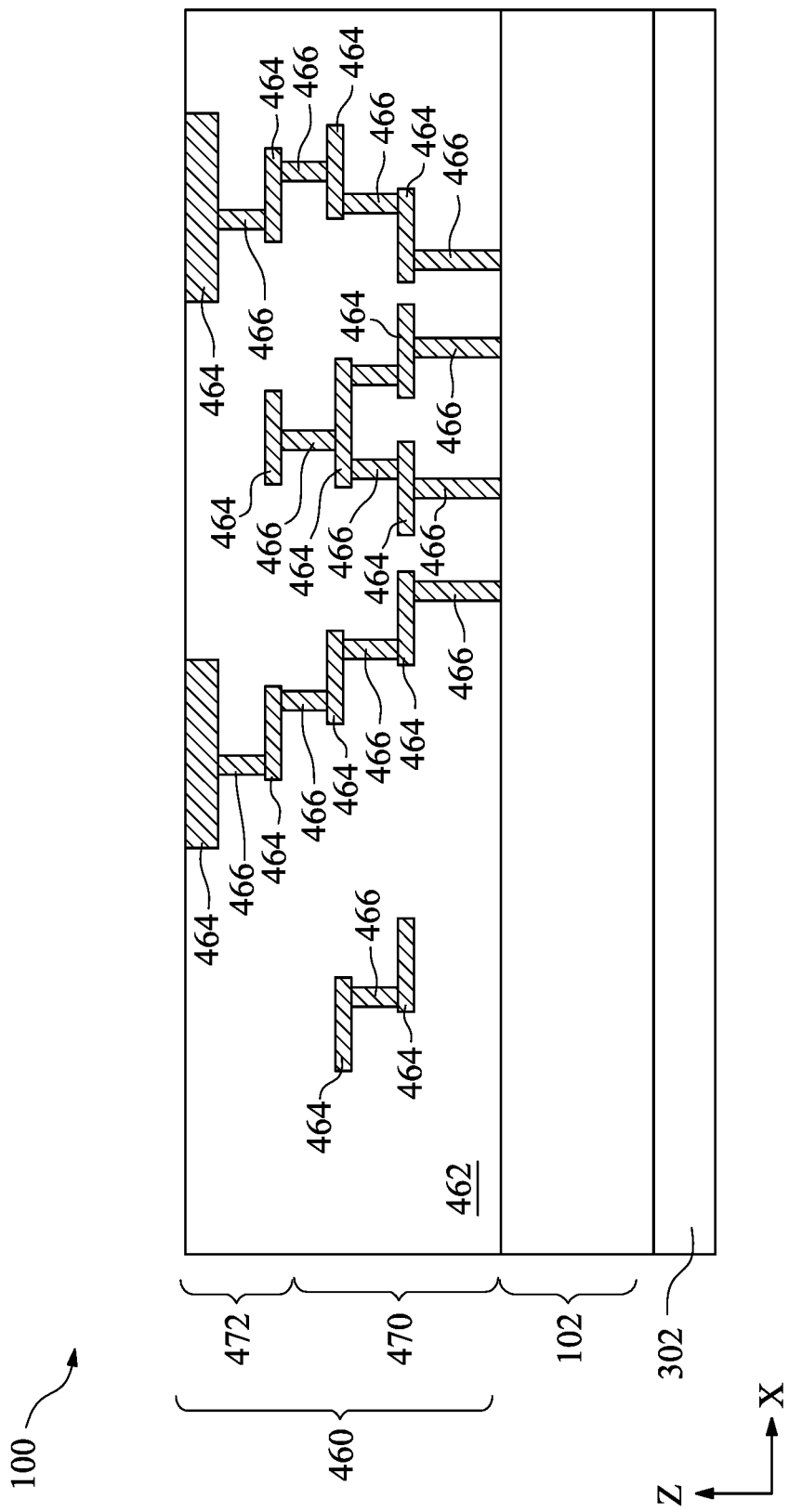

FIG. 4H is schematic cross-sectional side view of the semiconductor device structure 100 in accordance with some embodiments. The semiconductor device structure 100 may include the device layer 102 formed on and in the substrate 302 and an interconnection structure 460 formed over the device layer 102. The interconnection structure 460 includes various conductive features, such as a first plurality of conductive features 464 and second plurality of conductive features 466, and an intermetal dielectric (IMD) layer 462 to separate and isolate various conductive features 464, 466. In some embodiments, the first plurality of conductive features 464 are conductive lines and the second plurality of conductive features 466 are conductive vias. The interconnection structure 460 includes multiple levels of the conductive features 464, and the conductive features 464 are arranged in each level to provide electrical paths to various devices layer 102 disposed below. The conductive features 466 provide vertical electrical routing from the device layer 200 to the conductive features 464 and between conductive features 464. For example, the bottom-most conductive features 466 of the interconnection structure 460 may be electrically connected to the conductive contacts disposed over the S/D regions 104 (FIG. 2A) and the gate electrode layer 110 (FIG. 1B). The conductive features 464 and conductive features 466 may be made from one or more electrically conductive materials, such as metal, metal alloy, metal nitride, or silicide. For example, the conductive features 464 and the conductive features 466 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof.

The IMD layer 462 includes one or more dielectric materials to provide isolation functions to various conductive features 464, 466. The IMD layer 462 may include multiple dielectric layers embedding multiple levels of conductive features 464, 466. The IMD layer 462 is made from a dielectric material, such as SiOx, SiOxCyHz, SiOCN, SiON, or SiOxCy, where x, y and z are integers or non-integers. In some embodiments, the IMD layer 462 includes a low-k dielectric material having a k value less than that of silicon dioxide.

In some embodiments, the conductive features 464 disposed in a level of the interconnection structure 460 are partially overlapping with respect to the x-axis, which is substantially parallel to a major surface of the substrate 302, as shown in FIG. 4H. A level of the interconnection structure 460 may be a layer of the IMD layer 462. The layers are sometimes referred to as M1, M2, . . . M10, M11, et, with M1 being closest to the device layer 102. The air gap 418 described above may be included in any layers in the interconnection structure 460. Pitch of the conductive features 464, 466 increases from a lower portion 470 to an upper portion 472. In some embodiments, air gaps, such as the air gaps 418, may be located in one or more metal layers in the lower portion 470, for example M1, M2, but not presented in metal layers located in the upper portion 472, for example M10, M11. In some embodiments, the top metal layer does not include air gap. The partially overlapping conductive features 464 are described in detail below. Additional materials, such as glue layers, etch stop layers, and barrier layers, may be included in the interconnection structure 460 but are not shown in FIG. 4H for clarity.

An embodiment is an interconnection structure. The interconnection structure includes a first dielectric layer, a first conductive feature, a first liner layer, a second conductive feature, a second liner layer, and an air gap. The first conductive feature is disposed in the first dielectric layer. The first liner layer is disposed between the first conductive feature and the first dielectric layer. The second conductive feature penetrates the first dielectric layer. The second liner layer is disposed between the second conductive feature and the first dielectric layer. The air gap is disposed in the first dielectric layer between the first liner layer and the second liner layer. The first liner layer and the second liner layer include metal oxide, metal nitride, or silicon oxide doped carbide.

Another embodiment is a method for forming an interconnection structure. A first dielectric layer is deposited over a conductive layer. A first opening is formed in the first dielectric layer and a second opening penetrates the first dielectric layer to expose a portion of the conductive layer. A liner layer is formed over the first dielectric layer. A portion of the liner layer is removed to expose the conductive layer under the second opening. A barrier layer is deposited over the liner layer and the exposed conductive layer. A first conductive feature is formed in the first opening and a second conductive feature is formed in the second opening. A blocking layer is deposited on the first dielectric layer. A second dielectric layer is formed on the first conductive feature not covered by the blocking layer and a third dielectric layer is formed on the second conductive feature not covered by the blocking layer.

A further embodiment is a method for forming an interconnection structure. A first dielectric layer is formed over a conductive layer. A first opening is formed in the first dielectric layer and a second opening is formed penetrating the first dielectric layer to expose a portion of the conductive layer. A liner layer is formed over the first dielectric layer. A portion of the liner layer is removed to expose the conductive layer under the second opening. A blocking layer is deposited on the exposed conductive layer at the bottom of the second opening. A barrier layer is formed over the liner layer not covered by the blocking layer. The blocking layer is removed to expose the conductive layer at the bottom of the second opening. A first conductive feature is formed in the first opening over the barrier layer and a second conductive feature is formed in the second opening in direct contact with the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interconnection structure, comprising:
 depositing a first dielectric layer over a conductive layer;
 forming a first opening in the first dielectric layer and a second opening penetrating the first dielectric layer to expose a portion of the conductive layer;
 forming a liner layer over the first dielectric layer;
 removing a portion of the liner layer to expose the conductive layer under the second opening;
 depositing a barrier layer over the liner layer and the exposed conductive layer;
 forming a first conductive feature in the first opening and a second conductive feature in the second opening;
 depositing a blocking layer on the first dielectric layer; and
 forming a second dielectric layer on the first conductive feature not covered by the blocking layer and a third dielectric layer on the second conductive feature not covered by the blocking layer.

2. The method of claim 1, wherein depositing the blocking layer on the first dielectric layer, further comprises:
 selectively depositing a cap layer on the first conductive feature and the second conductive feature; and
 depositing the blocking layer on the first dielectric layer not covered by the cap layer.

3. The method of claim 2, wherein selectively depositing the cap layer on the first conductive feature and the second conductive feature, further comprises:
 performing a pretreatment operation on the first conductive feature and the second conductive feature to clean the surfaces of the first conductive feature and the second conductive feature.

4. The method of claim 1, wherein forming the second dielectric layer on the first conductive feature not covered by the blocking layer and the third dielectric layer on the second conductive feature not covered by the blocking layer, further comprises:
 performing a dielectric on metal (DOM) operation to selectively deposit the second dielectric layer on the first conductive feature and selectively deposit the third dielectric layer on the second conductive feature.

5. The method of claim 1, further comprising:
 forming a third opening between the first conductive feature and the second conductive feature; and
 depositing a fourth dielectric layer in the third opening to form an air gap between the first conductive feature and the second conductive feature.

6. The method of claim 5, wherein forming the third opening between the first conductive feature and the second conductive feature, further comprises:
 depositing an etch stop layer covering the first dielectric layer, the second dielectric layer, and the third dielectric layer;
 removing a portion of the etch stop layer to expose the third dielectric layer, a portion of the second dielectric layer, and a portion of the first dielectric layer; and
 performing an etch operation to remove a portion of the first dielectric layer and form the third opening.

7. The method of claim 5, wherein depositing the fourth dielectric layer in the third opening to form the air gap between the first conductive feature and the second conductive feature, further comprises:
 performing a non-conformal deposition operation to partially fill the third opening with the fourth dielectric layer.

8. The method of claim 7, wherein a lower portion of the air gap is wider than an upper portion of the air gap.

9. A method for forming an interconnection structure, comprising:
 depositing a first dielectric layer over a conductive layer;
 forming a first opening in the first dielectric layer and a second opening penetrating the first dielectric layer to expose a portion of the conductive layer;
 forming a liner layer over the first dielectric layer;
 removing a portion of the liner layer to expose the conductive layer at a bottom of the second opening;
 depositing a blocking layer on the exposed conductive layer at the bottom of the second opening;
 forming a barrier layer over the liner layer not covered by the blocking layer;
 removing the blocking layer to expose the conductive layer at the bottom of the second opening; and
 forming a first conductive feature in the first opening over the barrier layer and a second conductive feature in the second opening in direct contact with the conductive layer.

10. The method of claim 9, wherein the blocking layer and the barrier layer comprise different materials.

11. The method of claim 10, wherein the blocking layer comprises materials repelling the barrier layer.

12. The method of claim 9, further comprising:
 forming a second dielectric layer on the first conductive feature and a third dielectric layer on the second conductive feature;
 forming a third opening between the first conductive feature and the second conductive feature; and
 depositing a fourth dielectric layer in the third opening to form an air gap between the first conductive feature and the second conductive feature.

13. The method of claim 12, wherein forming the second dielectric layer on the first conductive feature and the third dielectric layer on the second conductive feature, further comprises:
 selectively depositing a cap layer on the first conductive feature and the second conductive feature; and
 performing a dielectric on metal (DOM) operation to selectively deposit the second dielectric layer and the third dielectric layer on the cap layer above the first conductive feature and the second conductive feature.

14. The method of claim 12, wherein forming the third opening between the first conductive feature and the second conductive feature, further comprises:
 depositing an etch stop layer covering the first dielectric layer, the second dielectric layer, and the third dielectric layer;
 removing a portion of the etch stop layer to expose the third dielectric layer, a portion of the second dielectric layer, and a portion of the first dielectric layer; and
 performing an etch operation to remove a portion of the first dielectric layer and form the third opening.

15. The method of claim 12, wherein depositing the fourth dielectric layer in the third opening to form the air gap between the first conductive feature and the second conductive feature, further comprises:
 performing a non-conformal deposition operation to partially fill the third opening with the fourth dielectric layer, wherein a lower portion of the air gap is wider than an upper portion of the air gap.

16. A method, comprising:
 depositing a first dielectric layer;
 forming a first opening in the first dielectric layer and a second opening penetrating the first dielectric layer, wherein the first opening is a trench formed through an upper portion of the first dielectric layer and the second opening penetrates the first dielectric layer;

depositing a liner layer in the first opening and the second opening, wherein the liner layer comprises metal oxide, metal nitride, or silicon oxide doped carbide;

forming a first conductive feature and a second conductive feature in the first opening and second opening respectively; and removing a portion of the first dielectric layer between the first conductive feature and a second conductive feature to form an air gap in the first dielectric layer, wherein a first portion of liner layer and the second portion of the liner layer is exposed to the air gap, the first portion of the liner layer is facing the first conductive feature, and the second portion of the liner layer is facing the second conductive layer.

17. The method of claim 16, further comprising:
forming a second dielectric layer over the first conductive feature and the second conductive feature.

18. The method of claim 17, further comprising:
forming an etch stop layer over the second dielectric layer, wherein the etch stop layer covers at least a portion of the first conductive feature without covering the second conductive feature.

19. The method of claim 17, further comprising:
forming a cap layer disposed between the second dielectric layer and the first and second conductive features.

20. The method of claim 16, further comprising:
forming a barrier layer on the liner layer prior to forming the first and second conductive features, wherein the barrier layer and the liner layer comprise different materials.

* * * * *